United States Patent
Huang et al.

(10) Patent No.: US 11,778,816 B2
(45) Date of Patent: Oct. 3, 2023

(54) ETCH METHOD FOR OPENING A SOURCE LINE IN FLASH MEMORY

(71) Applicant: Taiwan Semiconductor Manufacturing Company, Ltd., Hsin-Chu (TW)

(72) Inventors: Yong-Sheng Huang, Taipei (TW); Ming Chyi Liu, Hsinchu (TW); Chih-Pin Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/067,809

(22) Filed: Dec. 19, 2022

(65) Prior Publication Data
US 2023/0117612 A1   Apr. 20, 2023

Related U.S. Application Data

(60) Continuation of application No. 17/586,542, filed on Jan. 27, 2022, now Pat. No. 11,587,939, which is a
(Continued)

(51) Int. Cl.
*H01L 27/11521* (2017.01)
*H10B 41/30* (2023.01)
(Continued)

(52) U.S. Cl.
CPC ........ *H10B 41/30* (2023.02); *H01L 21/31111* (2013.01); *H01L 21/31144* (2013.01);
(Continued)

(58) Field of Classification Search
CPC ......... H01L 27/11521; H01L 29/40114; H01L 21/31111
See application file for complete search history.

(56) References Cited

U.S. PATENT DOCUMENTS

| 6,426,257 B1 | 7/2002 | Kanamori |
| 9,406,687 B1 | 8/2016 | Yang et al. |

(Continued)

FOREIGN PATENT DOCUMENTS

KR   20020045434 A   6/2002

OTHER PUBLICATIONS

Non-Final Office Action dated Jun. 24, 2021 for U.S. Appl. No. 16/800,167.
(Continued)

*Primary Examiner* — Errol V Fernandes
(74) *Attorney, Agent, or Firm* — Eschweiler & Potashnik, LLC

(57) ABSTRACT

Various embodiments of the present disclosure are directed towards a method for opening a source line in a memory device. An erase gate line (EGL) and the source line are formed elongated in parallel. The source line underlies the EGL and is separated from the EGL by a dielectric layer. A first etch is performed to form a first opening through the EGL and stops on the dielectric layer. A second etch is performed to thin the dielectric layer at the first opening, wherein the first and second etches are performed with a common mask in place. A silicide process is performed to form a silicide layer on the source line at the first opening, wherein the silicide process comprises a third etch with a second mask in place and extends the first opening through the dielectric layer. A via is formed extending through the EGL to the silicide layer.

20 Claims, 23 Drawing Sheets

Related U.S. Application Data division of application No. 16/800,167, filed on Feb. 25, 2020, now Pat. No. 11,239,245.

(60) Provisional application No. 62/893,954, filed on Aug. 30, 2019.

(51) Int. Cl.
| | |
|---|---|
| *H01L 21/28* | (2006.01) |
| *H01L 21/311* | (2006.01) |
| *H01L 21/3213* | (2006.01) |
| *H01L 21/762* | (2006.01) |
| *H01L 21/768* | (2006.01) |
| *H01L 23/522* | (2006.01) |
| *H01L 23/528* | (2006.01) |
| *H01L 29/423* | (2006.01) |
| *H01L 29/66* | (2006.01) |
| *H01L 29/788* | (2006.01) |

(52) U.S. Cl.
CPC .. *H01L 21/32133* (2013.01); *H01L 21/76224* (2013.01); *H01L 21/76802* (2013.01); *H01L 21/76877* (2013.01); *H01L 21/76892* (2013.01); *H01L 23/528* (2013.01); *H01L 23/5226* (2013.01); *H01L 29/40114* (2019.08); *H01L 29/42328* (2013.01); *H01L 29/66825* (2013.01); *H01L 29/7883* (2013.01)

(56) References Cited

U.S. PATENT DOCUMENTS

| | | |
|---|---|---|
| 2007/0257299 A1 | 11/2007 | Chen et al. |
| 2008/0128785 A1 | 6/2008 | Park et al. |
| 2010/0163960 A1 | 7/2010 | Park |
| 2015/0087123 A1 | 3/2015 | Wu et al. |
| 2016/0013198 A1 | 1/2016 | Liu |
| 2016/0056250 A1 | 2/2016 | Chuang et al. |
| 2016/0141296 A1 | 5/2016 | Yang et al. |
| 2016/0204118 A1 | 7/2016 | Wu et al. |
| 2017/0330889 A1 | 11/2017 | Richter et al. |
| 2018/0233509 A1 | 8/2018 | Cai et al. |

OTHER PUBLICATIONS

Notice of Allowance dated Sep. 28, 2021 for U.S. Appl. No. 16/800,167.
Notice of Allowance dated Oct. 12, 2022 for U.S. Appl. No. 17/586,542.

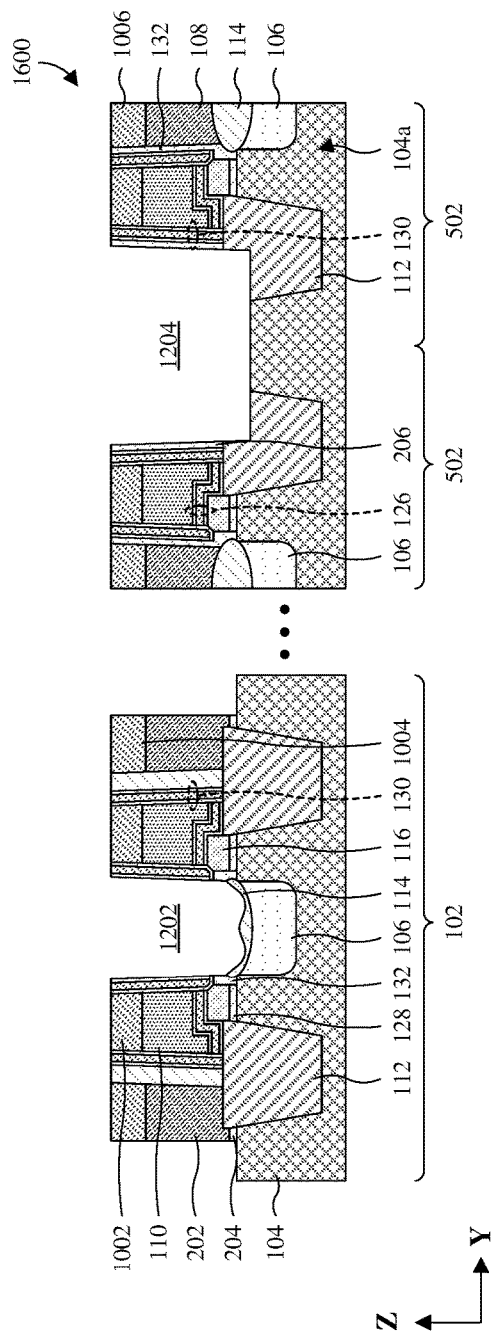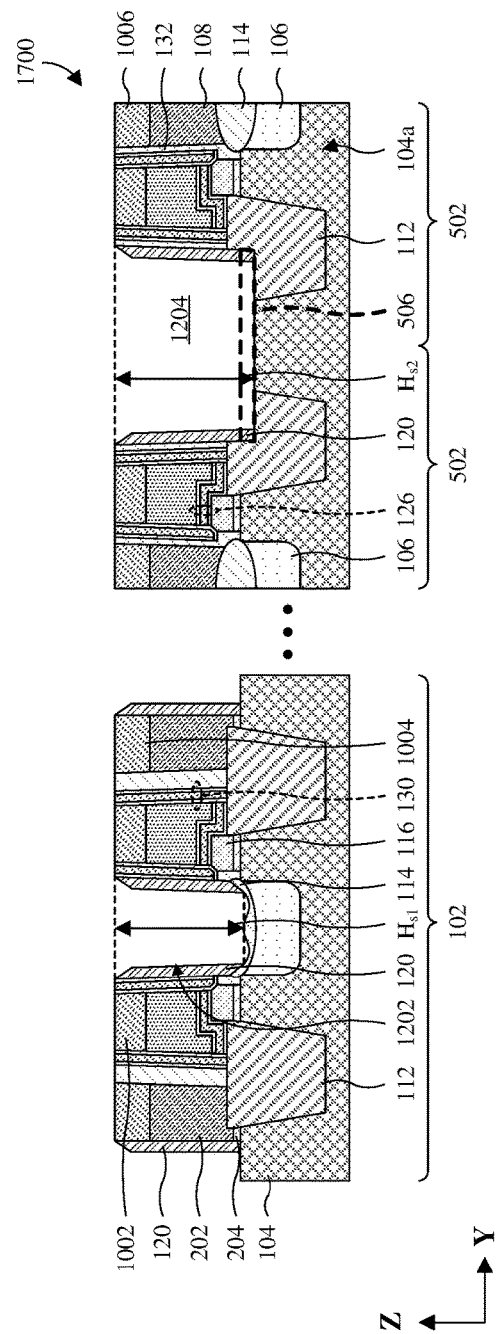
Fig. 16
Fig. 17

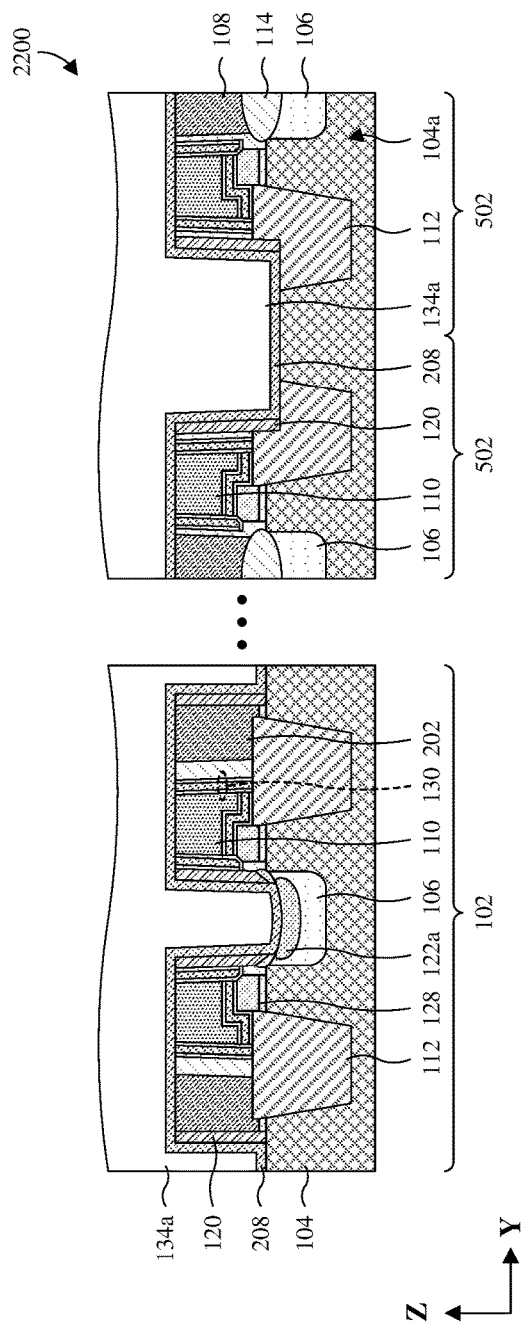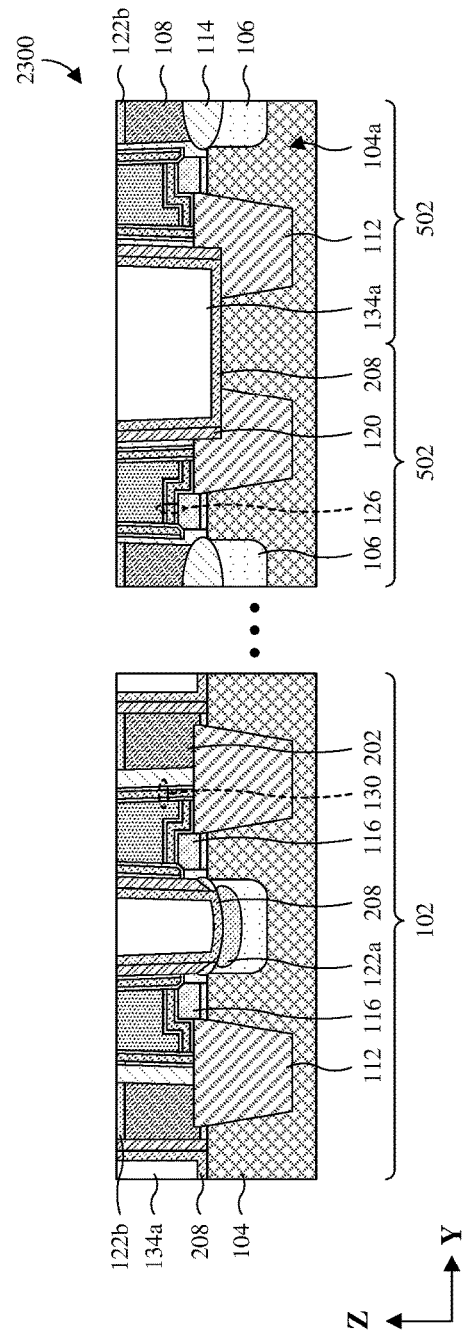

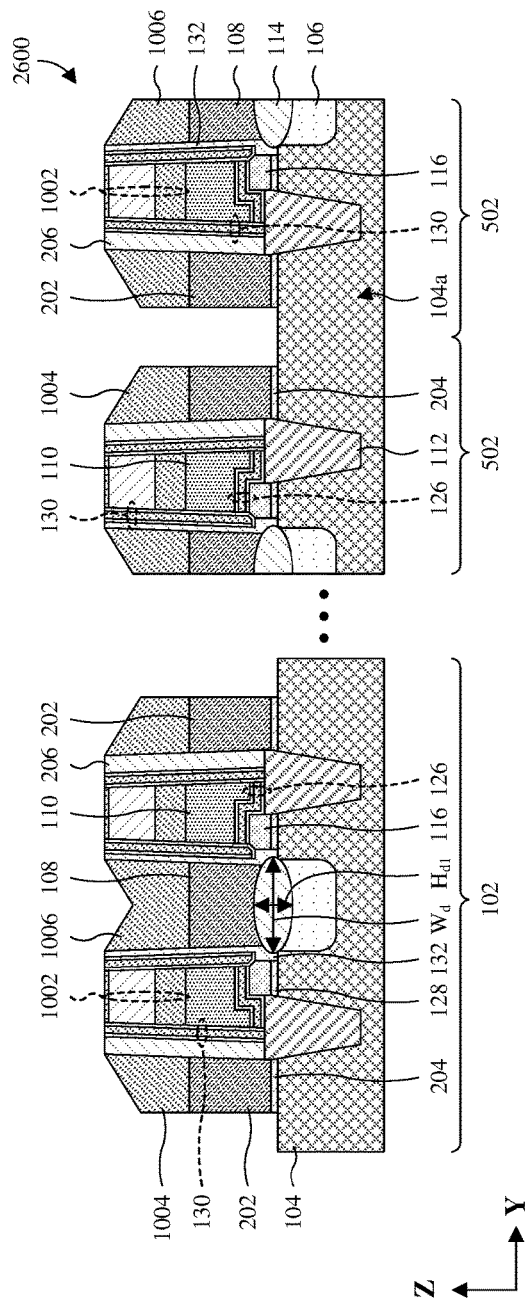
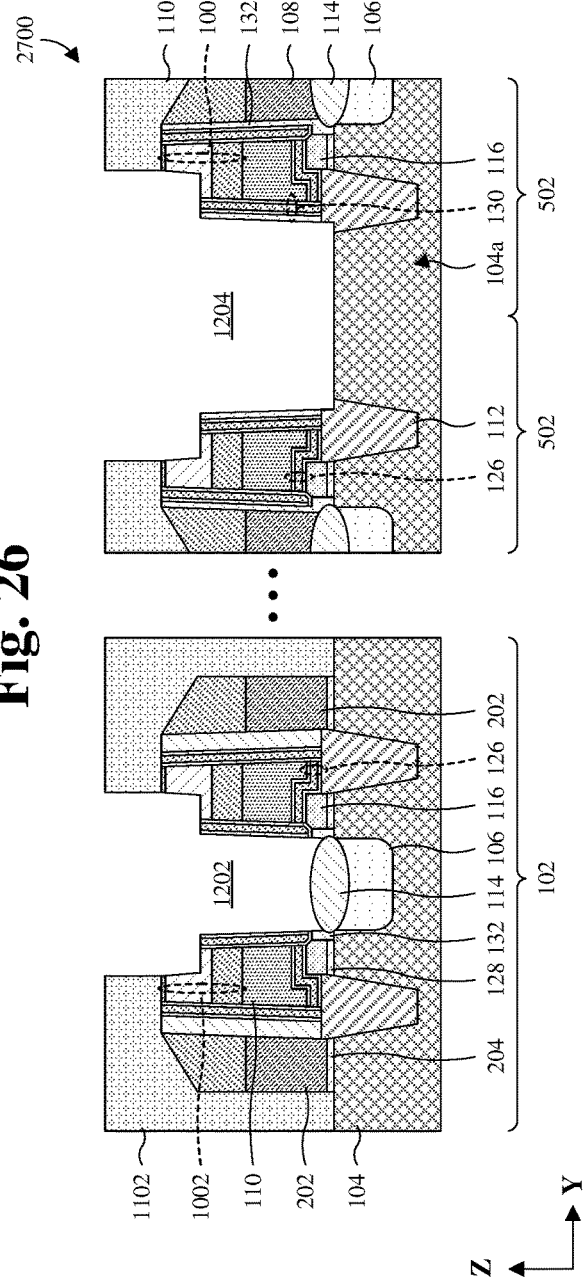
Fig. 26
Fig. 27

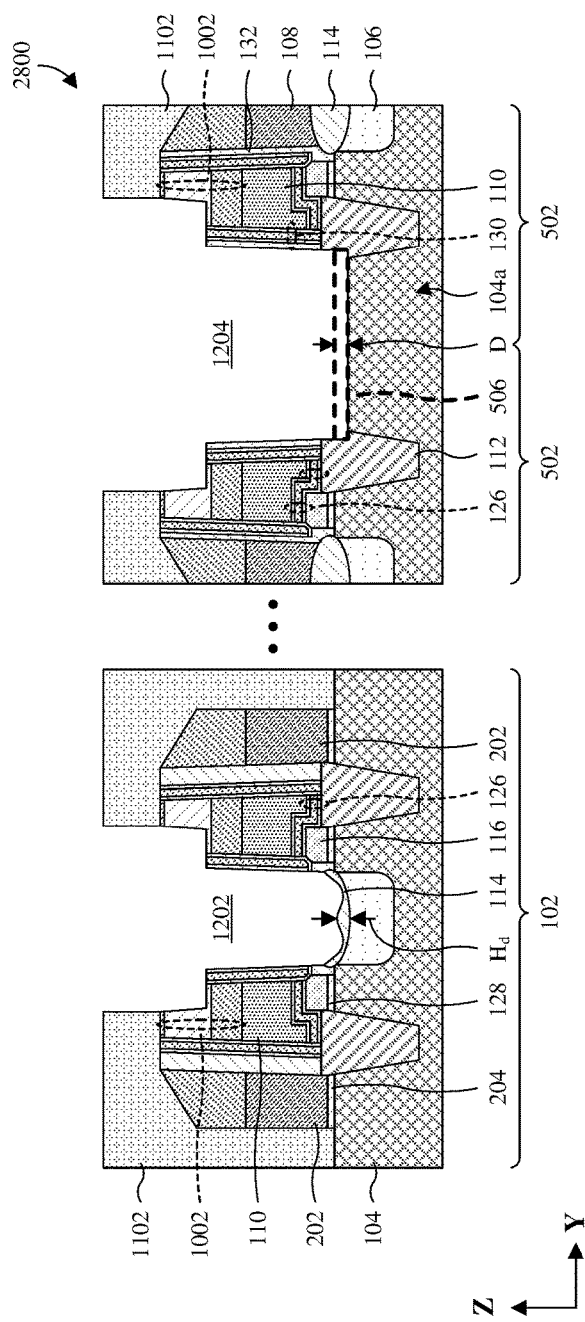
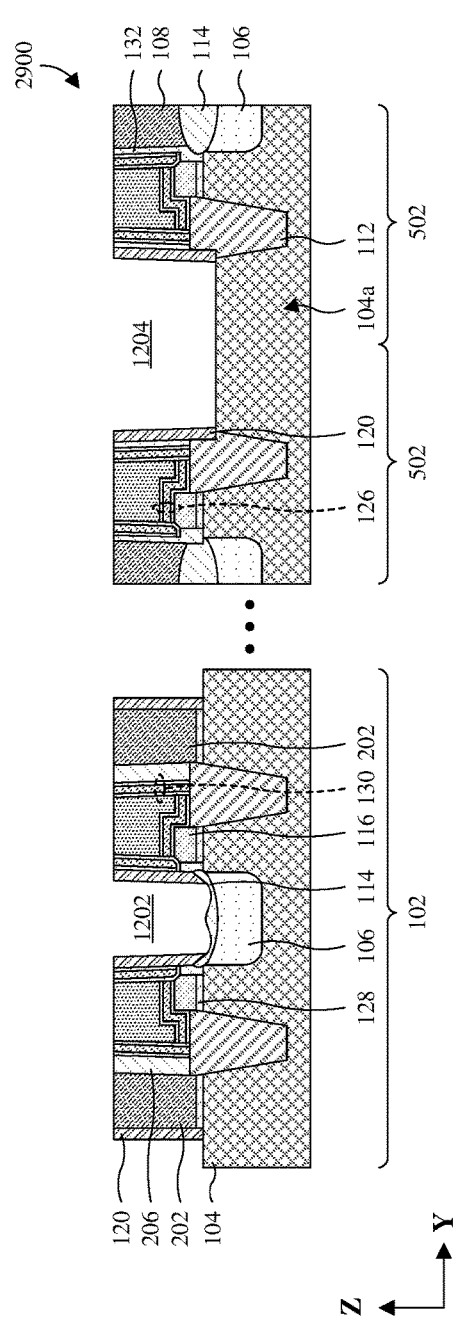
Fig. 28
Fig. 29

ETCH METHOD FOR OPENING A SOURCE LINE IN FLASH MEMORY

REFERENCE TO RELATED APPLICATIONS

This application is a Continuation of U.S. application Ser. No. 17/586,542, filed on Jan. 27, 2022, which is a Divisional of U.S. application Ser. No. 16/800,167, filed on Feb. 25, 2020 (now U.S. Pat. No. 11,239,245, issued on Feb. 1, 2022), which claims the benefit of U.S. Provisional Application No. 62/893,954, filed on Aug. 30, 2019. The contents of the above-referenced patent applications are hereby incorporated by reference in their entirety.

BACKGROUND

Many modern electronic devices include flash memory. Flash memory is an electronic non-volatile computer storage medium that can be electrically erased and reprogrammed. To store information, flash memory includes an addressable array of memory cells, typically made from floating gate transistors. Common types of flash memory cells include stacked-gate flash memory cells and split-gate flash memory cells (e.g., a third generation SUPERFLASH (ESF3) memory cell). Split-gate flash memory cells have lower power consumption, higher injection efficiency, less susceptibility to short channel effects, and over erase immunity compared to stacked-gate flash memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10-13 and 16-24 illustrate a series of cross-sectional views of some embodiments of a method for forming a memory device comprising a source strap cell and CG strap cells according to aspects of the present disclosure.

FIGS. 26-32 illustrate a series of cross-sectional views of some alternative embodiments of the method of FIGS. 10-13 and 16-24 in which an active region and a trench isolation structure have different layouts.

DETAILED DESCRIPTION

Figure 1A:
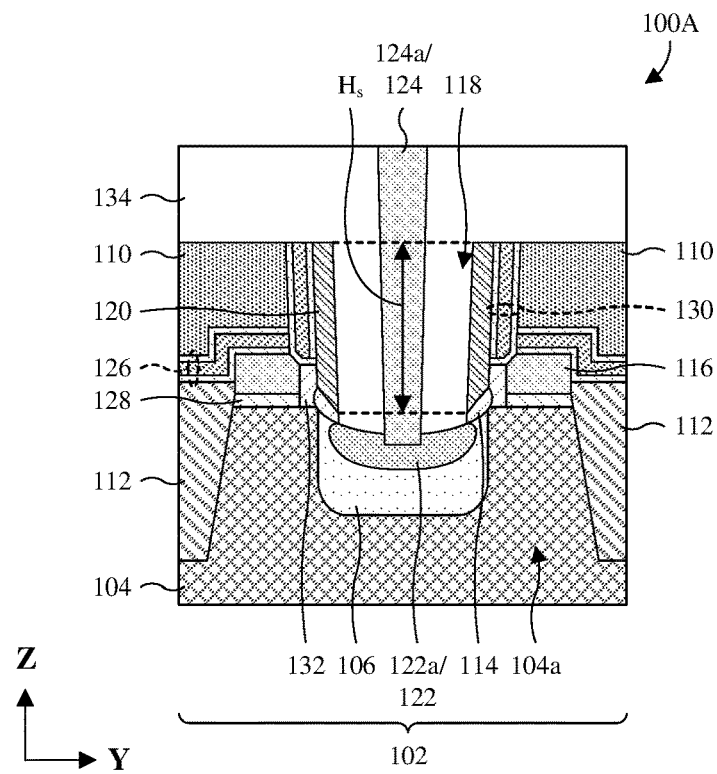
FIGS. 1A-1C illustrate various views of some embodiments of a memory device comprising a source strap cell according to aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory device may, for example, comprise a plurality of device lines. The plurality of device lines comprises a select gate (SG) line, a control gate (CG) line, an erase gate (EG) line, and a source line that are elongated in parallel. The CG line is between the EG and SG lines, and the source line underlies the EG line in a substrate. The plurality of device lines defines a plurality of memory cells and a plurality of strap cells spaced along lengths of the device lines. The strap cells electrically couple the device lines to metal lines with lower resistances than the device lines repeatedly along the device lines to reduce resistances and hence voltage drops along the device lines. At a strap cell for the source line (e.g., a source strap cell), the EG line has a break to allow access to the source line. At a strap cell for the CG line (e.g., a CG strap cell), the CG line has a pad protruding laterally. Further, the SG line has a break to prevent a risk of a contact via electrically shorting the CG and SG lines together and/or to prevent the SG line from electrically shorting with a neighboring SG line.

In some embodiments, while forming the source and CG strap cells, a first etch is performed into the EG line and the SG line with a first mask in place. The first etch stops on a source dielectric layer and a substrate portion respectively underlying the EG and SG lines. Further, the first etch simultaneously forms a first opening and a second opening respectively extending through the EG and SG lines respectively at the source and CG strap cells. Thereafter, a second etch is performed into the source dielectric layer, but not the substrate portion, with a second mask in place. The second etch removes a portion of the source dielectric layer in the first opening to expose the source line at the source strap cell. A resist protection oxide (RPO) layer is deposited lining the first opening, and a third etch is performed into the RPO layer with a third mask in place to extend the first opening through the RPO layer to the source line. A silicide layer is formed on the source line with the RPO layer in place, and a contact via is formed on the silicide layer. A challenge is that formation of the second mask may result in photoresist scum on the source line that persists even after removal of the second mask. The scum may prevent the silicide layer from properly forming on the source line and may hence lead to a high resistance connection between the contact via and the source line. The high resistance connection may lead to device failure and/or shift operating parameters (e.g., power consumption) out of specification, whereby bulk manufacturing yields may be low.

Various embodiments of the present disclosure are directed towards an enhanced etch method for opening the source line in the memory device, as well as the memory device itself. It has been appreciated that the second mask may be omitted and the second etch may instead be performed with the first mask in place to thin the source dielectric layer but not expose the source line. Further, the third etch may be extended (e.g., increased in duration) to extend the first opening through the source dielectric layer and to expose the source line. Hence, the enhanced etch method may use at least one less photomask. Because photomasks are costly to form and photolithography process tools are costly to use, one less photomask is a substantial cost savings. Additionally, because the second mask may be omitted, the risk of scum the source line in the first opening is reduced. This enlarges the process window (e.g., makes the process more resilient) for forming the silicide layer and the contact via.

Figure 1B:
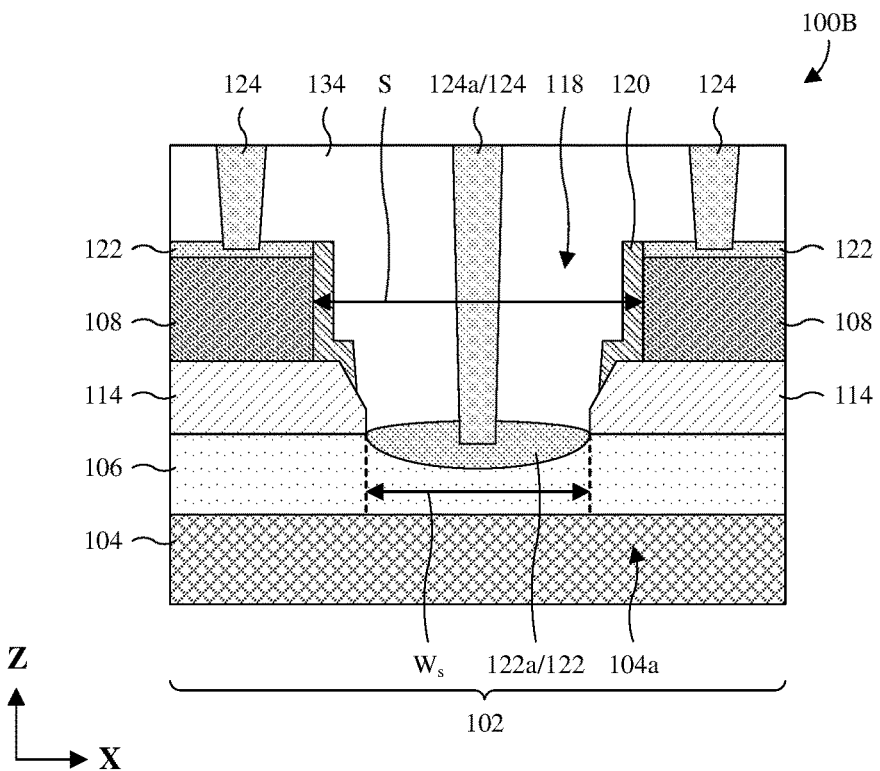
Figure 1C:
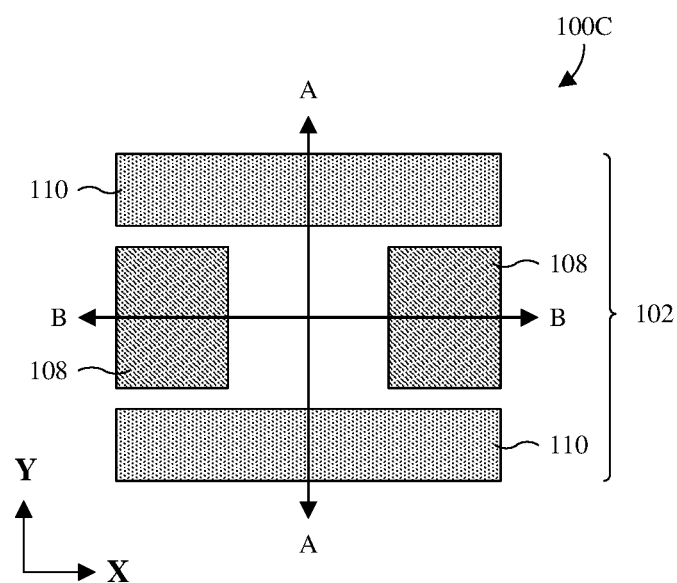

With reference to FIGS. 1A-1C, various views 100A-100C of some embodiments of a memory device comprising a source strap cell 102 is provided. FIG. 1A corresponds to a cross-sectional view 100A of the source strap cell 102 in a first direction (e.g., an Y direction), whereas FIG. 1B corresponds to a cross-sectional view 100B of the source strap cell 102 in a second direction (e.g., a X direction) orthogonal to the first direction. FIG. 1C corresponds to a top layout of the source strap cell 102. FIGS. 1A and 1B may, for example, be taken respectively along line A in FIG. 1C and line B in FIG. 1C. The memory device may, for example, be or be part of an integrated circuit (IC) chip or some other suitable semiconductor structure. Further, the memory device may, for example, be a third generation SUPERFLASH (ESF3) memory device or some other suitable split gate flash memory device.

The source strap cell 102 overlies an active region 104a of a substrate 104 and is defined in part by a source line 106, an EG line 108, and CG lines 110 that are elongated in parallel. For example, the various lines may be elongated in parallel along a column of a memory array. The active region 104a of the substrate 104 is a top region of the substrate 104 that is surrounded and demarcated by a trench isolation structure 112. The trench isolation structure 112 may be or comprise, for example, silicon oxide and/or some other suitable dielectric(s). Further, the trench isolation structure 112 may be or comprise, for example, a shallow trench isolation (STI) structure or some other suitable trench isolation structure. The substrate 104 may be, for example, a bulk monocrystalline silicon substrate, a silicon-on-insulator (SOI) substrate, or some other suitable semiconductor substrate.

The source line 106 and the EG line 108 are between the CG lines 110, and the EG line 108 overlies the source line 106 while remaining spaced from the source line 106 by a source dielectric layer 114. Further, the CG lines 110 respectively overlie floating gates 116 and are separated from a break 118 in the EG line 108 and the source dielectric layer 114 by main sidewall spacers 120. The break 118 separates (or breaks) the EG line 108 into separate EG segments along a length of the EG line 108. Silicide layers 122 are respectively on the EG line 108 and the source line 106, and contact vias 124 extend respectively to the silicide layers 122. The silicide layers 122 provide low resistance electrical coupling from the contact vias 124 respectively to the EG line 108 and the source line 106.

As seen hereafter, the source strap cell 102 may, for example, be formed using an enhanced method for opening the source line 106 (e.g., for forming the break 118 in the EG line 108 and the source dielectric layer 114). Instead of using a photolithography/etching process specifically for clearing the source dielectric layer 114 at the break 118, the enhanced method thins the source dielectric layer 114 while clearing the EG line 108 at the break 118 and etches through the source dielectric layer 114 while patterning a resist protect dielectric (RPD) layer (not shown) used during formation of a source silicide layer 122a. As such, the enhanced method may use one less photomask. Because photomasks are costly to form and photolithography process tools are costly to use, one less photomask is a substantial cost savings. Additionally, because one less photomask may be used, the risk of photoresist scum on the source line 106 may be reduced. The reduced scum risk may enlarge the process window (e.g., make the process more resilient) for forming the source silicide layer 122a and a source contact via 124a on the source silicide layer 122a. Hence, the reduced scum risk may reduce the likelihood of the source contact via 124a failing to properly electrically couple to the source silicide layer 122a. Too much scum on the source silicide layer 122a may prevent the source silicide layer 122a from fully forming on the source line 106, such that the source silicide layer 122a may be small and/or nonexistent. Hence, the source contact via 124a may fail to fully land on the source silicide layer 122a and resistance from the source contact via 124a to the source line 106 may be high. This high resistance may, in turn, shift operating parameters of the memory device out of specification and/or lead to low yields.

By opening the source line 106 according to the enhanced method, the main sidewall spacers 120 overlie a thinned portion of the source dielectric layer 114 in FIG. 1A. As such, a height $H_s$ of the main sidewall spacers 120 is greater than it would otherwise be in FIG. 1A. In some embodiments, the height $H_s$ of the main sidewall spacers 120 is about 400-800 angstroms, about 400-600 angstroms, about 600-800 angstroms, or some other suitable value. Further, by opening the source line 106 according to the enhanced method, a width $W_s$ of the source silicide layer 122a may be larger than it would otherwise be in FIG. 1B. Further, a ratio of the width $W_s$ to a separation S between EG segments of the EG line 108 may be larger than it would otherwise be in FIG. 1B. As such, the likelihood of the source contact via 124a properly landing on the source silicide layer 122a is increased. This enlarges the process window for forming the source contact via 124a and reduces the likelihood of source contact via 124a failing to properly electrically couple to the source contact via 124a.

In some embodiments, the width $W_s$ of the source silicide layer 122a is about 800-1100 angstroms, about 800-950 angstroms, about 950-1100 angstroms, or some other suitable value. If the width $W_s$ is too small (e.g., less than about 800 angstroms or some other suitable value), the likelihood of the source contact via 124a properly landing on the source silicide layer 122a may be low. As such, the process window for forming the source contact via 124a may be small and the likelihood of high resistance, or no, electrically coupling between the source contact via 124a and the source line 106 may be high. If the width $W_s$ is too large (e.g., greater than about 1100 or some other suitable value), scaling down of the memory device may be hindered for little to no gain in the process window for the source contact via 124a.

In some embodiments, a ratio of the width $W_s$ to the separation S is greater than about 0.4:1.0, about 0.5:1.0, about 0.6:1.0, or some other suitable ratio. In some embodiments, a ratio of the width $W_s$ to the separation S is about 0.4:1.0 to about 0.6:1.0, about 0.6:1.0 to 0.8:1.0, or some other suitable ratio. If the ratio is too low (e.g., less than about 0.4:1.0 or some other suitable ratio), the source silicide layer 122a may be small and the likelihood of the source contact via 124a properly landing on the source silicide layer 122a may be low.

With continued reference to FIGS. 1A-1C, the source line 106 may, for example, be or comprise a doped portion of the substrate 104 and/or some other suitable semiconductor region. The EG line 108, the CG lines 110, and the floating gates 116 may, for example, be or comprise doped polysilicon and/or some other suitable conductive material(s). The silicide layers 122 may, for example, be or comprise metal silicide and/or some other suitable silicide(s). The contact vias 124 may be or comprise, for example, metal and/or some other suitable conductive material(s). The source dielectric layer 114 may, for example, be or comprise silicon oxide and/or some other suitable dielectric(s).

The CG lines 110 are separated from the floating gates 116 by corresponding CG dielectric layers 126, and the floating gates 116 are separated from the substrate 104 by corresponding floating gate dielectric layers 128. Further, the CG lines 110 are separated from the main sidewall spacers 120 by corresponding CG sidewall spacers 130, and the floating gates 116 are separated from the main sidewall spacers 120 by corresponding EG tunnel dielectric layers 132. In some embodiments, the EG tunnel dielectric layers 132 and the source dielectric layer 114 are defined by a common layer. The CG dielectric layers 126 and the CG sidewall spacers 130 may be or comprise, for example, silicon oxide, silicon nitride, some other suitable dielectric(s), or any combination of the foregoing. In some embodiments, as illustrated, the CG dielectric layers 126 and the CG sidewall spacers 130 are oxide-nitride-oxide (ONO) films. The floating gate dielectric layers 128 and the EG tunnel dielectric layers 132 may be or comprise, for example, silicon oxide and/or some other suitable dielectric(s).

An interconnect dielectric layer 134 covers the source strap cell 102 and fills the break 118 in the EG line 108 and the source dielectric layer 114. Further, the interconnect dielectric layer 134 surrounds the contact vias 124. The interconnect dielectric layer 134 may, for example, be or comprise silicon oxide and/or some other suitable dielectric(s).

While FIGS. 1A-1C are described together with regard to the same memory device, each of FIGS. 1A-1C may stand alone independent of each other one of FIGS. 1A-1C. For example, a memory device may have the cross-sectional view 100A of FIG. 1A but may not have the cross-sectional view 100B of FIG. 1B and/or the top layout 100C of FIG. 1C. As another example, a memory device may have the cross-sectional view 100B of FIG. 1B but may not have the cross-sectional view 100A of FIG. 1A and/or the top layout 100C of FIG. 1C.

Figure 2A:
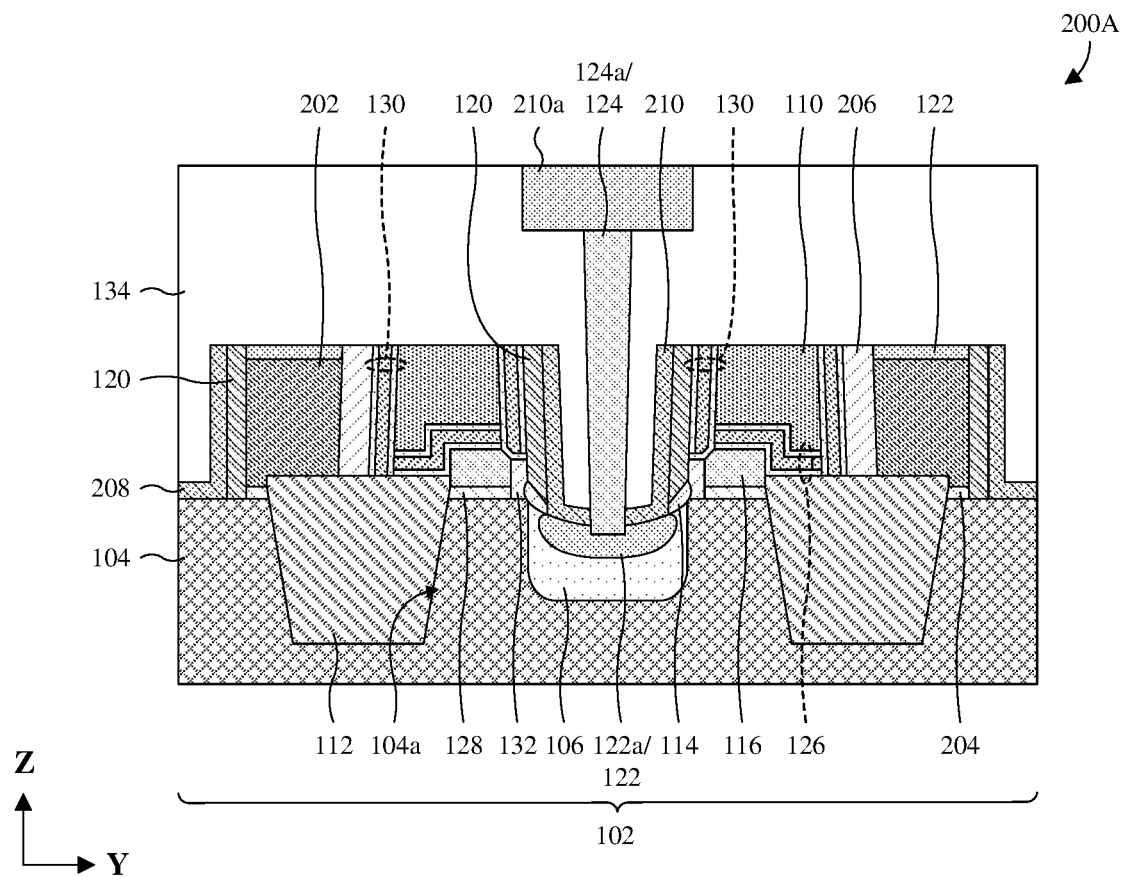
FIGS. 2A-2D illustrate expanded cross-sectional views of various embodiments of the source strap cell at FIG. 1A.

With reference to FIG. 2A, an expanded cross-sectional view 200A of some embodiments of the source strap cell 102 of FIG. 1A is provided in which the source strap cell 102 is further defined in part by SG lines 202. The SG lines 202 are elongated in parallel (not visible in the cross-sectional view 200A) with the CG lines 110, and the CG lines 110 are between and respectively border the SG lines 202. Further, the SG lines 202 partially overlie the trench isolation structure 112 and are separated from the substrate 104 by corresponding SG dielectric layers 204. The SG lines 202 may, for example, be or comprise doped polysilicon and/or some other suitable conductive material(s). The SG dielectric layers 204 may, for example, be or comprise silicon oxide and/or some other suitable dielectric(s).

The CG sidewall spacers 130 and SG sidewall spacers 206 separate the CG lines 110 respectively from the SG lines 202. The CG sidewall spacers 130 are on sidewalls of the CG lines 110, whereas the SG sidewall spacers 206 are on sidewalls of the SG lines 202 that face the CG lines 110. Further, the main sidewall spacers 120 are on sidewalls of the SG lines 202 that face away from the CG lines 110. The SG sidewall spacers 206 may be or comprise, for example, silicon oxide and/or some other suitable dielectric(s). In some embodiments, the CG sidewall spacers 130 are or comprise ONO films, the SG sidewall spacers 206 are or comprise silicon oxide, and the main sidewall spacers 120 are or comprise silicon nitride. Other materials are, however, amenable for one or any combination of the aforementioned spacers.

The silicide layers 122 are on the SG lines 202 to provide low resistance electrically coupling from the SG lines 202 to SG contact vias (not shown). Further, a contact etch stop layer (CESL) 208 is on the main sidewall spacers 120 and the source silicide layer 122a, and the source contact via 124a extends through the CESL 208 from a source line wire 210a to the source silicide layer 122a. The source line wire 210a is in the interconnect dielectric layer 134 and may be or comprise, for example, metal and/or some other suitable conductive material(s). The CESL 208 may be or comprise, for example, silicon oxide, silicon nitride, some other suitable dielectric(s), or any combination of the foregoing.

Figure 2B:
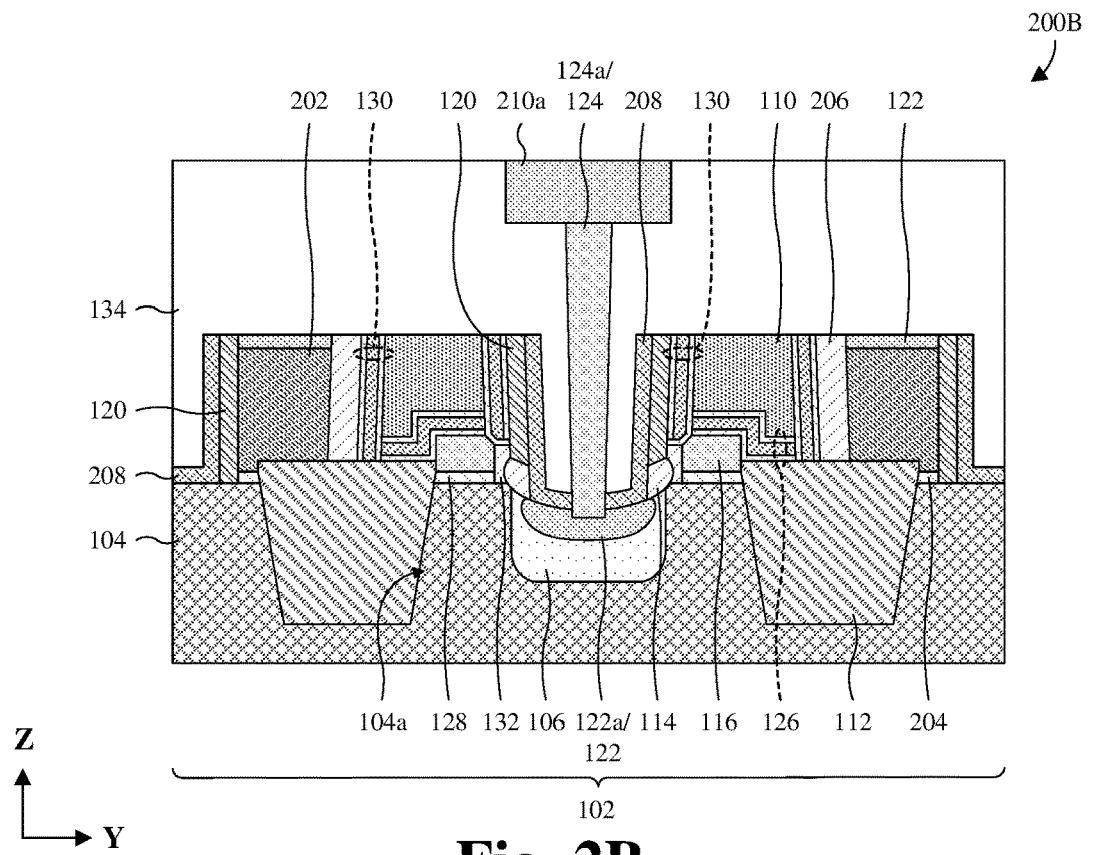

With reference to FIG. 2B, a cross-sectional view 200B of some alternative embodiments of the source strap cell 102 of FIG. 2A is provided in which main sidewall spacers 120 between the CG lines 110 have bottommost points at a same level as the floating gates 116 and/or the floating gate dielectric layers 128.

Figure 2C:
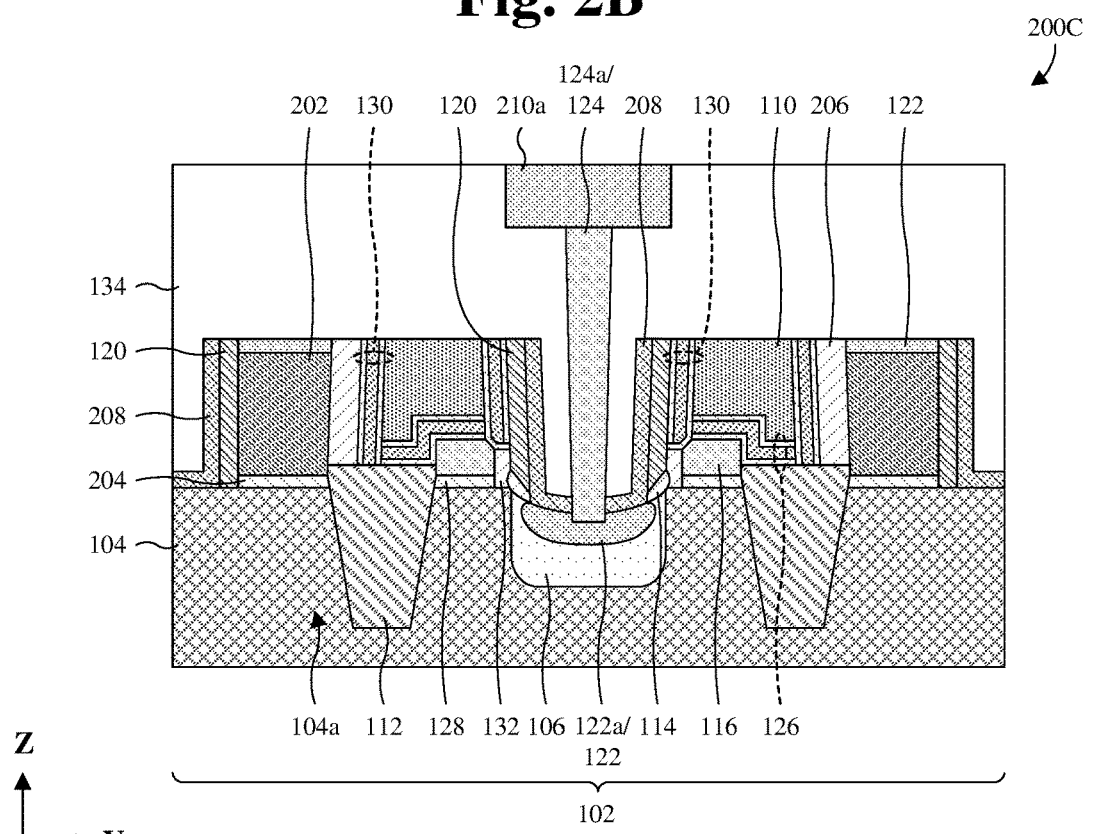

With reference to FIG. 2C, a cross-sectional view 200C of some alternative embodiments of the source strap cell 102 of FIG. 2A is provided in which the SG lines 202 are to sides of the trench isolation structure 112. In other words, the SG lines 202 do not overlie the trench isolations structure 112.

Figure 2D:
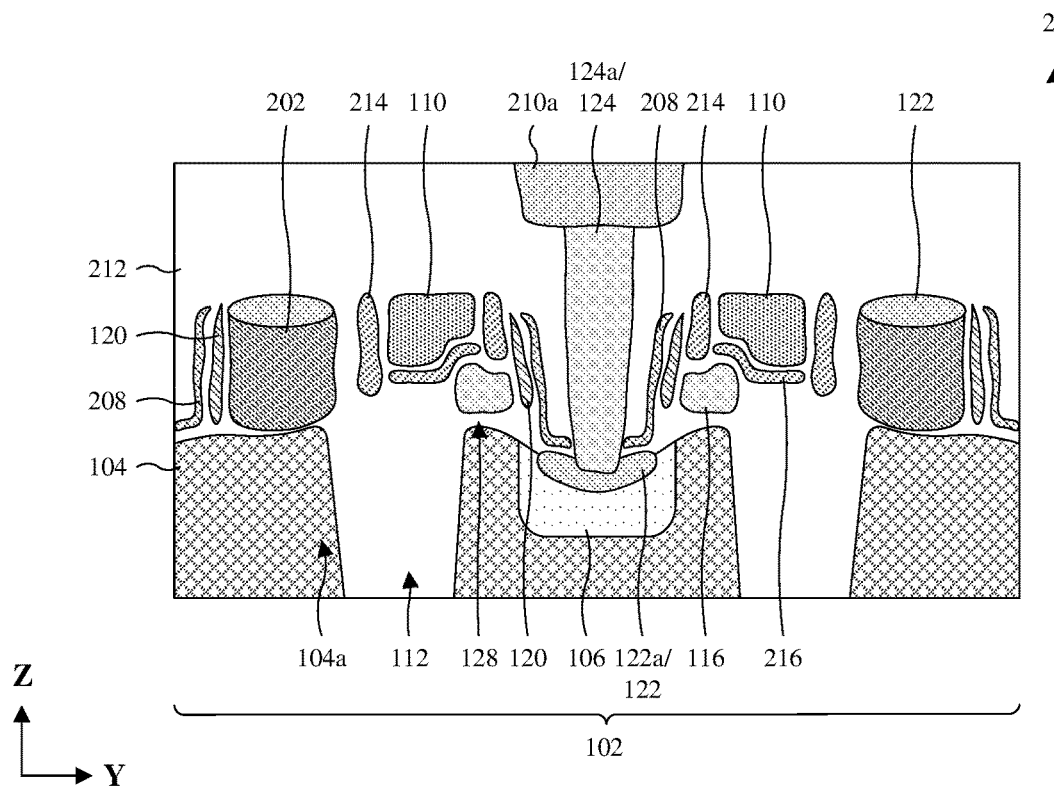

With reference to FIG. 2D, a cross-sectional view 200D of some alternative embodiments of the source strap cell 102 of FIG. 2C is provided in which a common dielectric structure 212 surrounds and separates constituents of the source strap cell 102. Among other things, the common dielectric structure 212 surrounds and separates the floating gates 116, the CG lines 110, the silicide layers 122, the CESL 208, sidewall spacers 214, and gate dielectric layers 216. Further, the common dielectric structure 212 defines constituents of the source strap cell 102. Among other things, the common dielectric structure 212 defines the trench isolation structure 112 and the floating gate dielectric layers 128. The common dielectric structure 212 may, for example, be or comprise silicon oxide and/or some other suitable dielectric(s). The sidewall spacers 214 and/or the gate dielectric layers 216 may, for example, be or comprise silicon nitride and/or some other suitable dielectric(s).

While not labeled to simplify FIG. 2D, it is to be appreciated that the common dielectric structure 212 and the sidewall spacers 214 may, for example, collectively define the CG sidewall spacers 130 of FIG. 2C. For example, the common dielectric structure 212 and the sidewall spacers 214 may collectively define ONO films corresponding to the CG sidewall spacers 130 of FIG. 2C. Further, the common dielectric structure 212 and the gate dielectric layers 216 may, for example, collectively define the CG dielectric layers 126 of FIG. 2C. For example, the common dielectric structure 212 and the gate dielectric layers 216 may collectively define ONO films corresponding to the CG dielectric layers 126 of FIG. 2C.

Figure 3A:
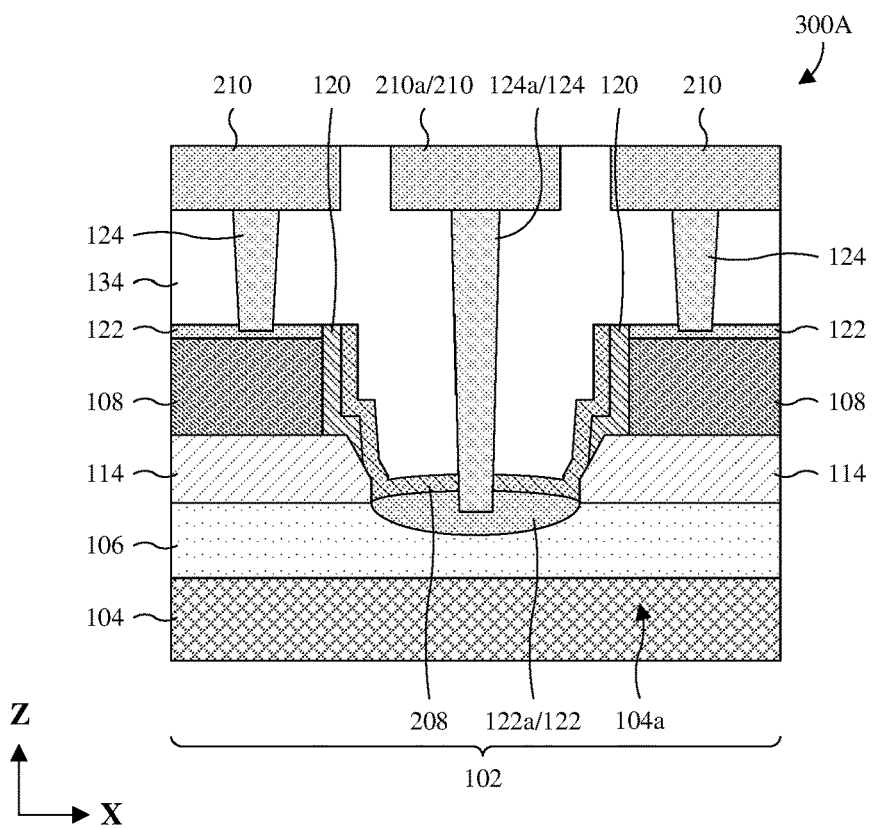
FIGS. 3A and 3B illustrate expanded cross-sectional views of various embodiments of the source strap cell at FIG. 1B.

With reference to FIG. 3A, an expanded cross-sectional view 300A of some embodiments of the source strap cell 102 of FIG. 1B is provided in which the contact vias 124 extend respectively to the silicide layers 122 respectively from wires 210. Further, the CESL 208 is on the main sidewall spacers 120, and the source contact via 124a extends through the CESL 208. The wires 210 are in the interconnect dielectric layer 134 and may be or comprise, for example, metal and/or some other suitable conductive material(s).

Figure 3B:
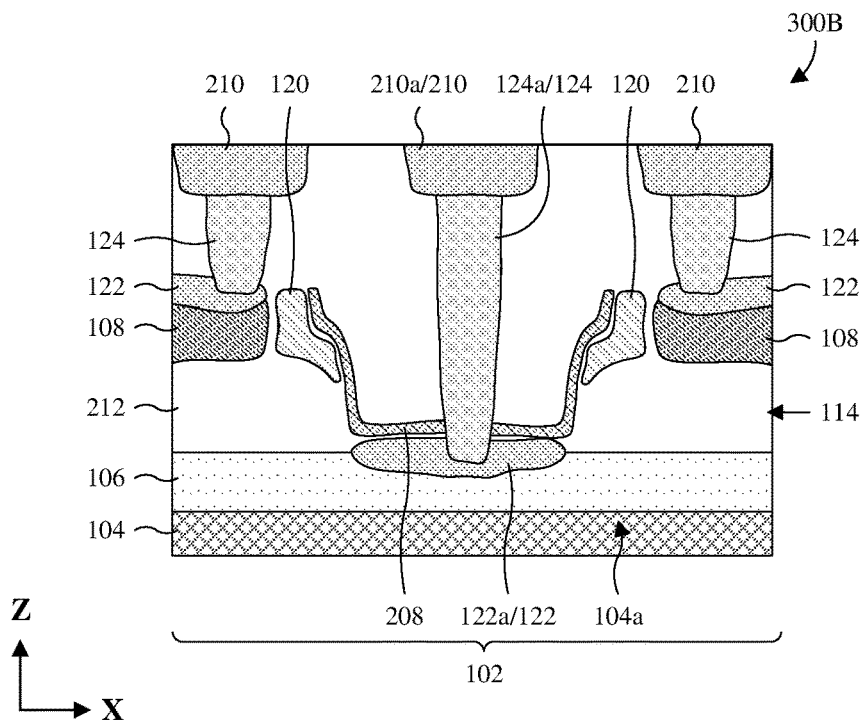

With reference to FIG. 3B, a cross-sectional view 300B of some alternative embodiments of the source strap cell 102 of FIG. 3A is provided in which the common dielectric structure 212 surrounds and separates constituents of the source strap cell 102. Among other things, the common dielectric structure 212 surrounds and separates the EG line 108, the silicide layers 122, the main sidewall spacers 120, and the CESL 208. Further, the common dielectric structure 212 defines constituents of the source strap cell 102. Among other things, the common dielectric structure 212 defines the source dielectric layer 114.

Figure 4:
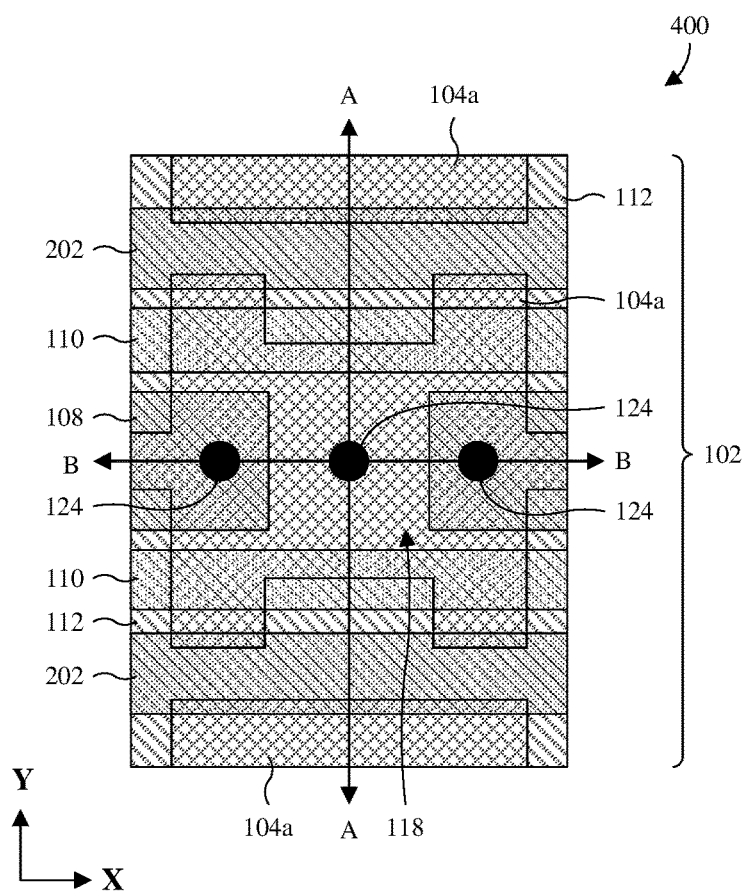
FIG. 4 illustrates a more detailed top layout of some embodiments of the source strap cell at FIG. 1C.

With reference to FIG. 4, an expanded top layout 400 of some embodiments of the source strap cell 102 of FIG. 1C is provided in which the SG lines 202 are laterally elongated in parallel with the CG lines 110 and the EG line 108. Further, the SG lines 202, the CG lines 110, and the EG line 108 overlap with the trench isolation structure 112 and the active region 104a, and the trench isolation structure 112 surrounds and demarcates the active region 104a. Any one of the cross-sectional views 100A, 200A-200D of FIGS. 1A and 2A-2D may, for example, be taken along line A and/or any one of the cross-sectional views 100B, 300A, 300B of FIGS. 1B, 3A, and 3B may, for example, be taken along line B.

Figure 5:
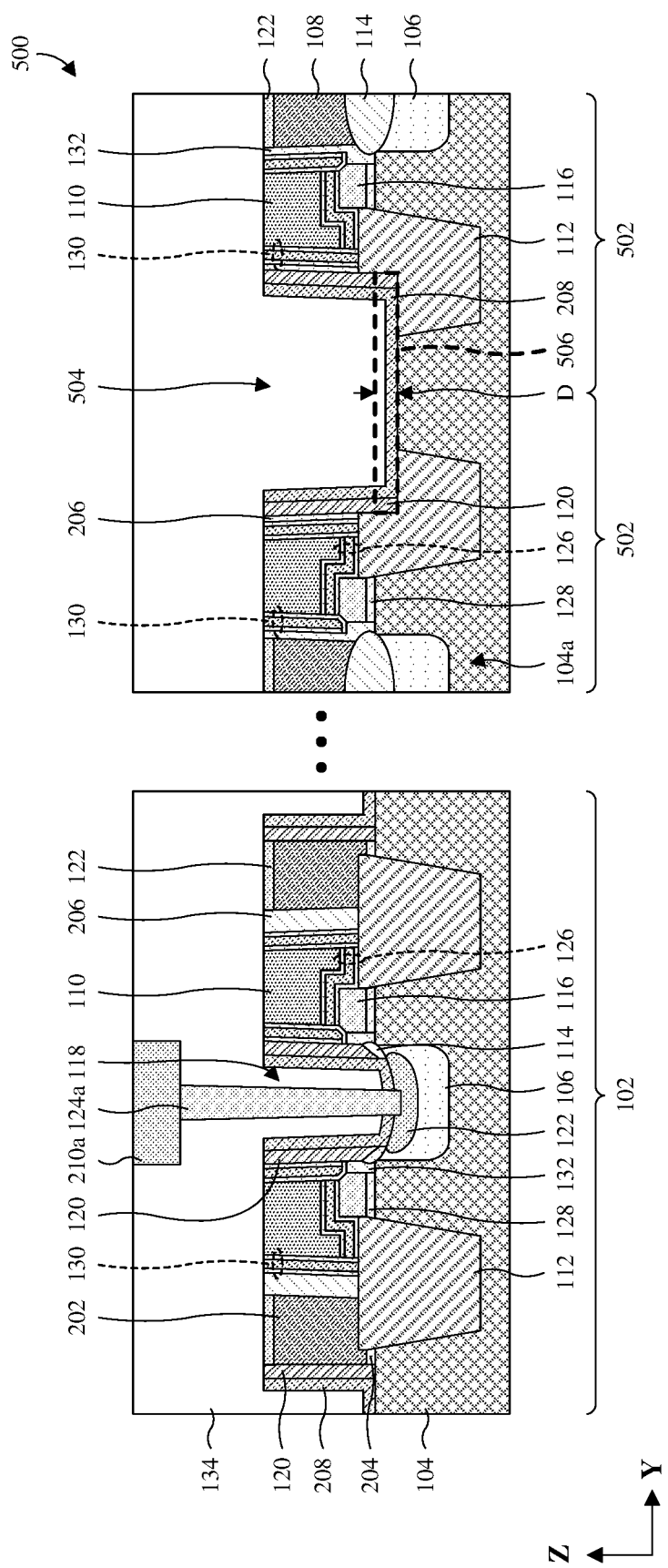
FIG. 5 illustrates a cross-sectional view of some embodiments of a memory device comprising a source strap cell and control gate (CG) strap cells according to aspects of the present disclosure.

With reference to FIG. 5, a cross-sectional view 500 of some embodiments of a memory device comprising a source strap cell 102 and CG strap cells 502 is provided. The memory device may, for example, be or be part of an IC chip or some other suitable semiconductor structure. Further, the memory device may, for example, be an ESF3 memory device or some other suitable split gate flash memory device.

The source strap cell 102 and the CG strap cells 502 overlie a trench isolation structure 112 and an active region 104a of a substrate 104. Further, the source strap cell 102 and the CG strap cells 502 are defined in part by source lines 106, EG lines 108, CG lines 110, and SG lines 202 that are elongated in parallel (not visible in the cross-sectional view 500 of FIG. 5). The source strap cell 102 is as illustrated and described in FIG. 2A, but may, for example, alternatively be as illustrated and described in any one or combination of FIGS. 1A-1C, 2B-2D, 3A, 3B, and 4 or alternatively be as any other suitable source strap cell.

The source lines 106 respectively border the CG lines 110 on first sides of the CG lines 110, and the EG lines 108 respectively overlie the source lines 106 while remaining spaced from the source line 106 by source dielectric layers 114. Note that the source dielectric layer 114 of the source strap cell 102 is partially removed, whereas the source dielectric layers 114 of the CG strap cells 502 are complete. Further, the SG lines 202 respectively border the CG lines 110 on second sides of the CG lines 110, and the CG lines 110 respectively overlie the floating gates 116. The EG line of the source strap cell 102 (not visible) and the source dielectric layer 114 of the source strap cell 102 have a first break 118 at the source strap cell 102, and the SG lines (not visible) of the CG strap cell 502 have a second break 504 at the CG strap cells 502.

As seen hereafter, the source strap cell 102 may, for example, be formed by an enhanced method for opening the source line 106. During the enhanced method, a first photolithography/etching process clears the EG line of the source strap cell 102 at the first break 118 while simultaneously clearing the SG lines of the CG strap cells 502 at the second break 504. Further, instead of using a second photolithography/etching process specifically for clearing the source dielectric layer 114 at the first break 118, the enhanced method thins the source dielectric layer 114 of the source strap cell 102 during the first photolithography/etching process and etches through a remainder of the source dielectric layer while patterning a RPD layer (not shown) used during formation of the silicide layer 122 at the first break 118. As such, the first photolithography/etching process is extended.

Because the first photolithography/etching process is extended, and the first photolithography/etching process is performed on the SG lines 202 of the CG strap cells 502, the first photolithography/etching process extends into the substrate 104 and the trench isolation structure 112 at the CG strap cell 502. This, in turn, forms a recess 506 that has a depth D, which is measured from a top surface of the substrate 104. In some embodiments, the depth D is greater than about 50 angstroms or greater than about 100 angstroms and/or is less than about 200 angstroms, less than about 250 angstroms, or less than about 300 angstroms. Other suitable values are, however, amenable. If the depth D is too large (e.g., greater than about 300 angstroms or some other suitable value), metal may become trapped in the recess 506. Such trapped metal may cause contamination of process tools, undesired electrical shorting, or other suitable challenges. If the depth D is too small (e.g., less than about 50 angstroms or some other suitable value), the source dielectric layer 114 of the source strap cell 102 may be insufficiently thinned and the patterning of the RPD layer may be unable to etch through the remainder of the source dielectric layer. As such, the contact via 124 of the source strap cell 102 may fail to electrically couple to the source line 106 of the source strap cell 102.

With continued reference to FIG. 5, the CG lines 110 are separated respectively from the trench isolation structure 112 and the floating gates 116 by corresponding CG dielectric layers 126. Further, the floating gates 116 are separated from the substrate 104 by corresponding floating gate dielectric layers 128, and the SG lines 202 are separated from the substrate 104 by corresponding SG dielectric layers 204. The CG lines 110 are separated from the EG lines 108 and the SG lines 202 by corresponding CG sidewall spacers 130. The CG lines 110 are further separated from the EG lines 108 by corresponding EG tunnel dielectric layers 132 and are further separated from the SG lines 202 by corresponding SG sidewall spacers 206. The CG sidewall spacers 130 are on sidewalls of the CG lines 110, the EG tunnel dielectric layers 132 are on sidewalls of the floating gates 116 and sidewalls of the EG lines 108, and the SG sidewall spacers 206 are on sidewalls of the SG lines 202.

A CESL 208 lines outer sidewalls of the source strap cell 102 and the CG strap cells 502, and main sidewall spacers 120 separate the CESL 208 respectively from the outer sidewalls. Silicide layers 122 are respectively on the SG lines 202, the EG lines 108, and the source line 106 of the source strap cell 102. A source line wire 210a and a source contact via 124a overlie the silicide layer 122 of the source strap cell 102, and the source contact via 124a extends from the source line wire 210a to the silicide layer 122 of the source strap cell 102. An interconnect dielectric layer 134 covers the source strap cell 102 and the CG strap cells 502. Further, the interconnect dielectric layer 134 fills the first and second breaks 118, 504 and surrounds the source line wire 210a and the source contact via 124a.

Figure 6A:
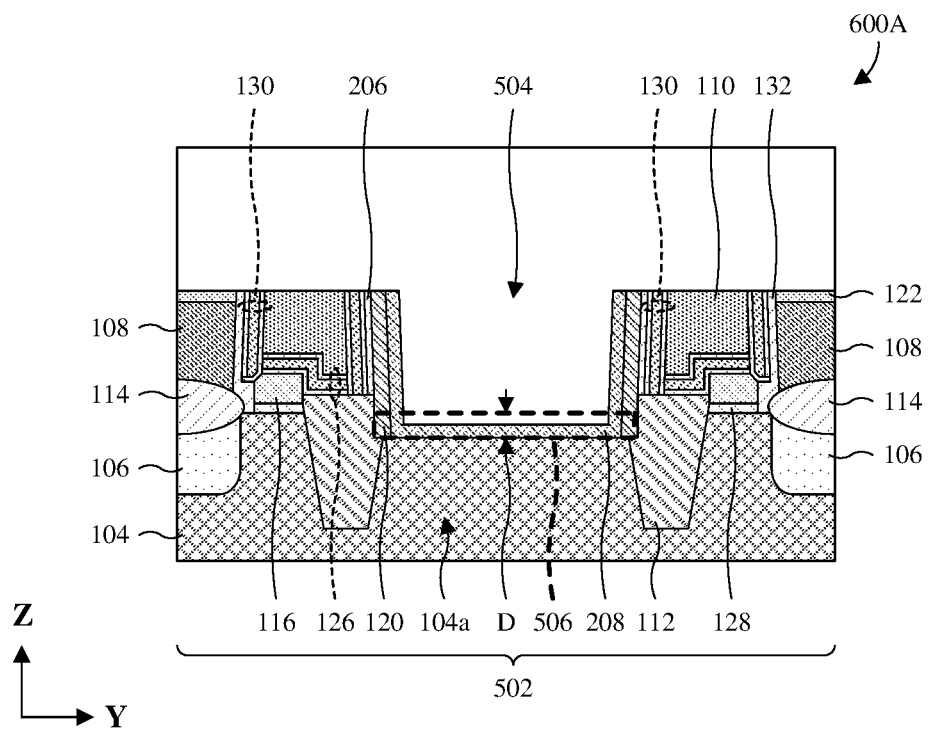
FIGS. 6A and 6B illustrate cross-sectional views of some alternative embodiments of the CG strap cells at FIG. 5.
Figure 6B:
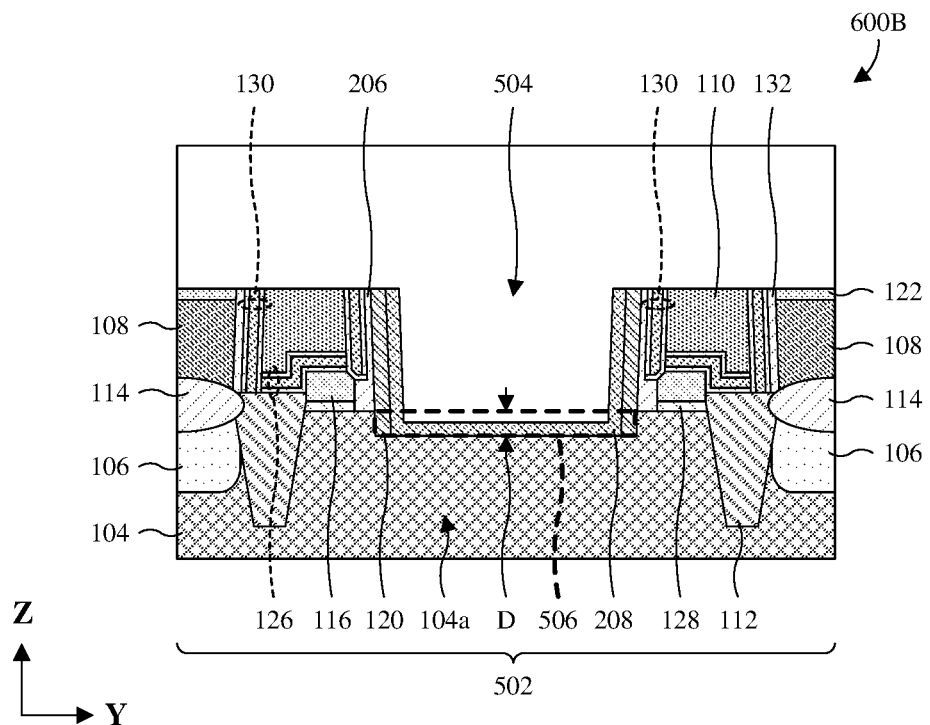

With reference to FIGS. 6A and 6B, various cross-sectional views 600A, 600B of some alternative embodiments of the GC strap cells 502 of FIG. 5 are provided in which the recess 506 is substantially defined by the substrate 104 and the trench isolation structure 112 is substantially localized under the CG lines 110. In FIG. 6A, the trench isolation structure 112 neighbors the second break 504 and the recess 506. In FIG. 6B, the trench isolation structure 112 neighbors the EG lines 108.

Figure 7:
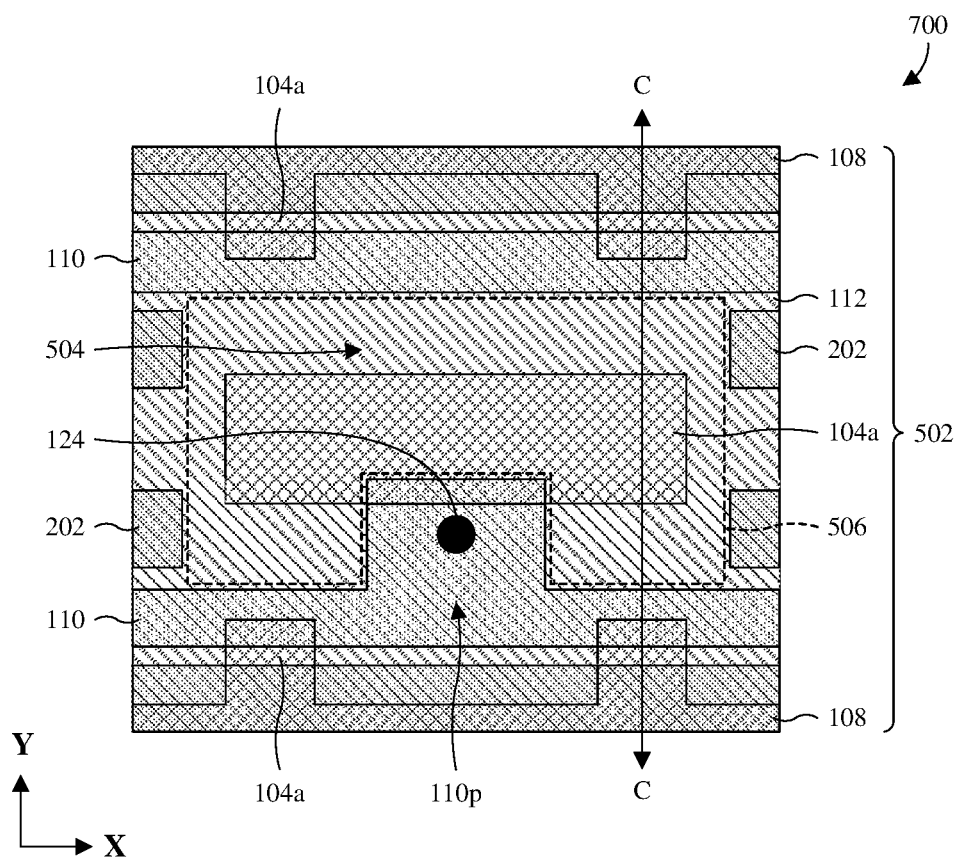
FIG. 7 illustrates a top layout of some embodiments of the CG strap cells at FIG. 5.

With reference to FIG. 7, a top layout 700 of some embodiments of the GC strap cells 502 of FIG. 5 is provided. The GC strap cell 502 of FIG. 5 may, for example, be taken along line C but other suitable locations are, however, amenable. In alternative embodiments, the GC strap cells 502 in any one of FIGS. 6A and 6B may, for example, be taken along line C by modifying the top layout of the trench isolation structure 112 and the top layout of the active region 104a. The CG lines 110, the EG lines 108, and the SG lines 202 are laterally elongated in parallel and overlap with the trench isolation structure 112 and the active region 104a. Further, one of the CG lines 110 has a pad 110p at the break 504, the recess 506 wraps around the pad 110p, and a contact via 124 extends from the pad 110p to electrically couple the pad 110p to a metal line (not shown). In some embodiments, the recess 506 is U or C shaped. In alternative embodiments, the recess 506 has some other suitable shape.

Figure 8:
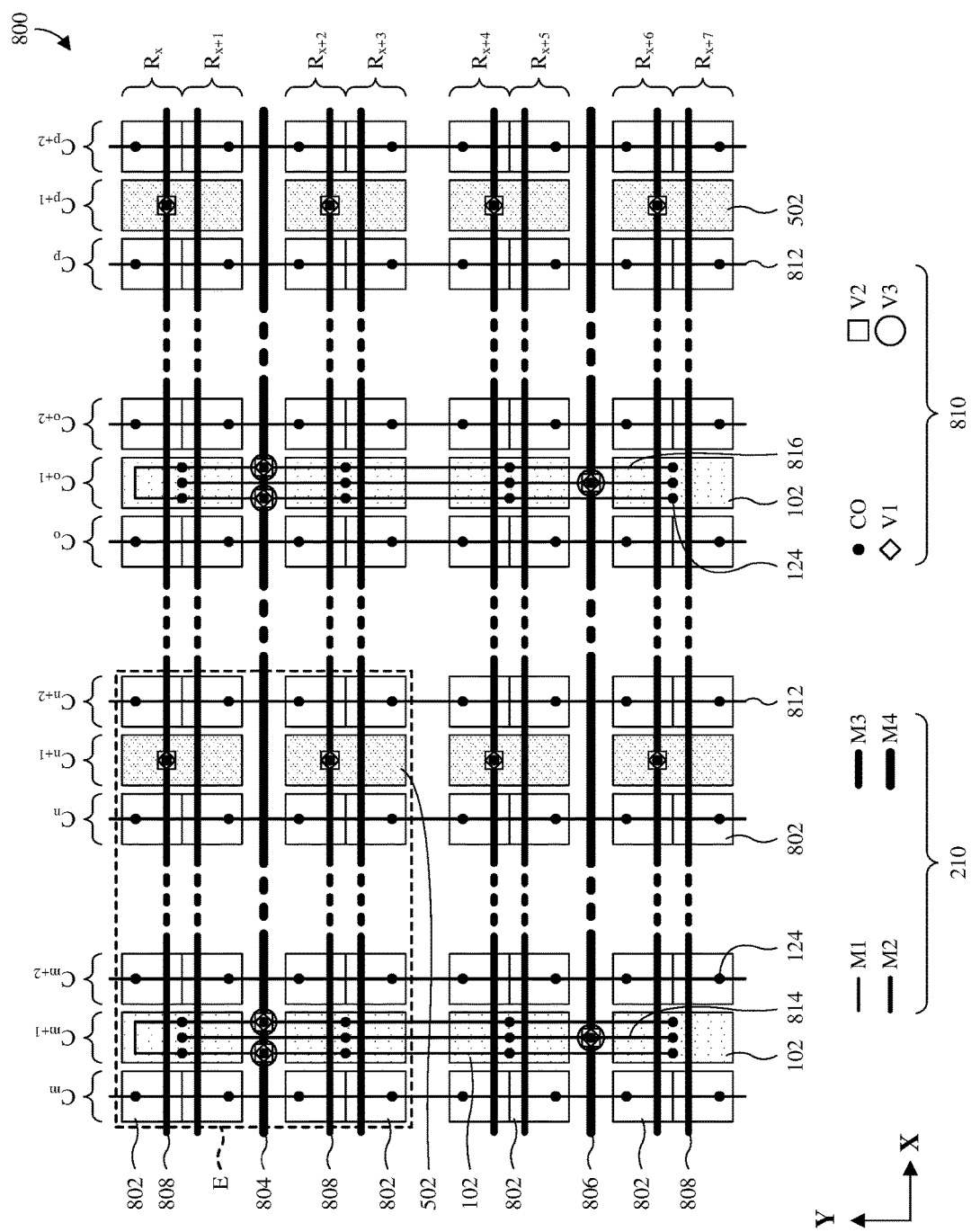
FIG. 8 illustrates a schematic top diagram of some embodiments of a memory device comprising a memory array in which the source and CG strap cells of FIG. 5 are arranged and further comprising wires and vias interconnecting cells of the memory array.

With reference to FIG. 8, a schematic top diagram 800 of some embodiments of a memory device comprising a memory array is provided in which the source strap cell 102 of FIG. 5 and the GC strap cell 502 of FIG. 5 are arranged. The memory array comprises a plurality of cells in a plurality of rows and a plurality of columns. The rows are respectively labeled $R_x$ through $R_{x+7}$ and the columns are respectively labeled $C_m$ through $C_{m+2}$, $C_n$ through $C_{n+2}$, $C_o$ through $C_{o+2}$, and $C_p$ through $C_{p+2}$. The subscripts of the row and column labels identify corresponding row and column numbers. Further, x is an integer variable representing a row number whereas m, n, o, and p are integer variables representing column numbers.

The plurality of cells comprises a plurality of source strap cells 102, a plurality of CG strap cells 502, and a plurality of memory cells 802 repeating along each of the rows. In some embodiments, the plurality of cells further comprises SG strap cells and/or other types of strap cells that are not shown. The source strap cells 102 electrically couple source lines (not shown) and EG lines (not shown) to a corresponding source strap line 804 and a corresponding EG strap line 806. As such, the source strap cells 102 may, for example, also be known as source/erase gate (SEG) strap cells. The CG strap cells 502 electrically couple CG lines (not shown) to corresponding CG strap lines 808. The CG lines, the EG lines, and the source lines extend along the rows and partially define the plurality of cells. The memory cells 802 store individual bits of data and may, for example, be ESF3 memory cells, split gate flash memory cells, or some other suitable memory cells. The source strap cells 102 may, for example, be as in any one or combination of FIGS. 1A-1C, 2A-2D, 3A, 3B, 4, and 5 and/or the GC strap cells 502 may, for example, be as in any one or combination of the FIGS. 5, 6A, 6B, and 7.

An interconnect structure interconnects the plurality of cells and comprises a plurality of wires 210 and a plurality of vias 810. Note that the wires 210 and the vias 810 are only labeled in the legend below the memory array. The wires 210 are grouped into a plurality of wire levels and the vias 810 are grouped into a plurality of via levels. A level corresponds to an elevation above the memory array when the memory device is viewed in cross section. The plurality of wire levels comprises a first wire level M1, a second wire level M2, a third wire level M3, and a fourth wire level M4. The wire levels are schematically illustrated by thicknesses of the wires 210 and elevation above the memory array increases with wire thickness. The plurality of via levels comprises a contact via level CO (e.g., a zero via level), a first via level V1, a second via level V2, and a third via level V3. The via levels are schematically illustrated by shape and/or color. For example, a black circle corresponds to contact vias 124 in the contact via level CO, whereas a white square corresponds to vias in the second via level V2.

Vias in the contact via level CO extend from the cells to wires in the first wire level M1, and vias in the first via level V1 extend from wires in the first wire level M1 to wires in the second wire level M2. Further, vias in the second via level V2 extend from wires in the second wire level M2 to wires in the third wire level M3, and vias in the third via level V3 extend from wires in the third wire level M3 to wires in the fourth wire level M4. Note that where vias at different levels directly overlap, the intervening wires are not shown.

The plurality of wires 210 comprises a plurality of bit lines 812, a plurality of source shunt wires 814, and a plurality of EG shunt wire 816 in the first wire level M1. The bit lines 812 extend along columns (e.g., columns $C_m$, $C_{m+2}$, $C_{n+2}$, $C_o$, etc.) at which the memory cells 802 are located and electrically couple to memory cells in corresponding columns through vias in the contact via level CO. The source and EG shunt wires 814, 816 extend along the column (e.g., columns $C_{m+1}$ and $C_{o+1}$) at which the source strap cells 102 are located and electrically couple respectively to source lines (not shown) and EGs (not shown) at the source strap cells 102 through contact vias in the contact via level CO.

Additionally, the plurality of wires 210 comprises the source strap line 804, the EG strap line 806, and the CG strap lines 808. The source and EG strap lines 804, 806 are in the fourth wire level M4 and electrically couple respectively to the source and EG shunt wires 814, 816 through vias in the first, second, and third via levels V1, V2, and V3. The CG strap lines 808 are in the third wire level M3 and electrically couple to CG lines (not shown) in corresponding rows at the CG strap cells 502 through contact vias in the contact via level CO and the first and second via levels V1, V2.

While FIG. 8 illustrates the various strap lines and the various shunt wires as being in certain wire levels, some or all of the strap lines and/or some or all of the shunt wires may be in different wire levels in alternative embodiments. For example, the CG strap lines 808 may be in the second wire level M2 in alternative embodiments. As another example, the EG strap line 806 may be in the fourth wire level M4 and the source strap line 804 may be in a fifth wire level (not shown), or vice versa, in alternative embodiments.

Figure 9:
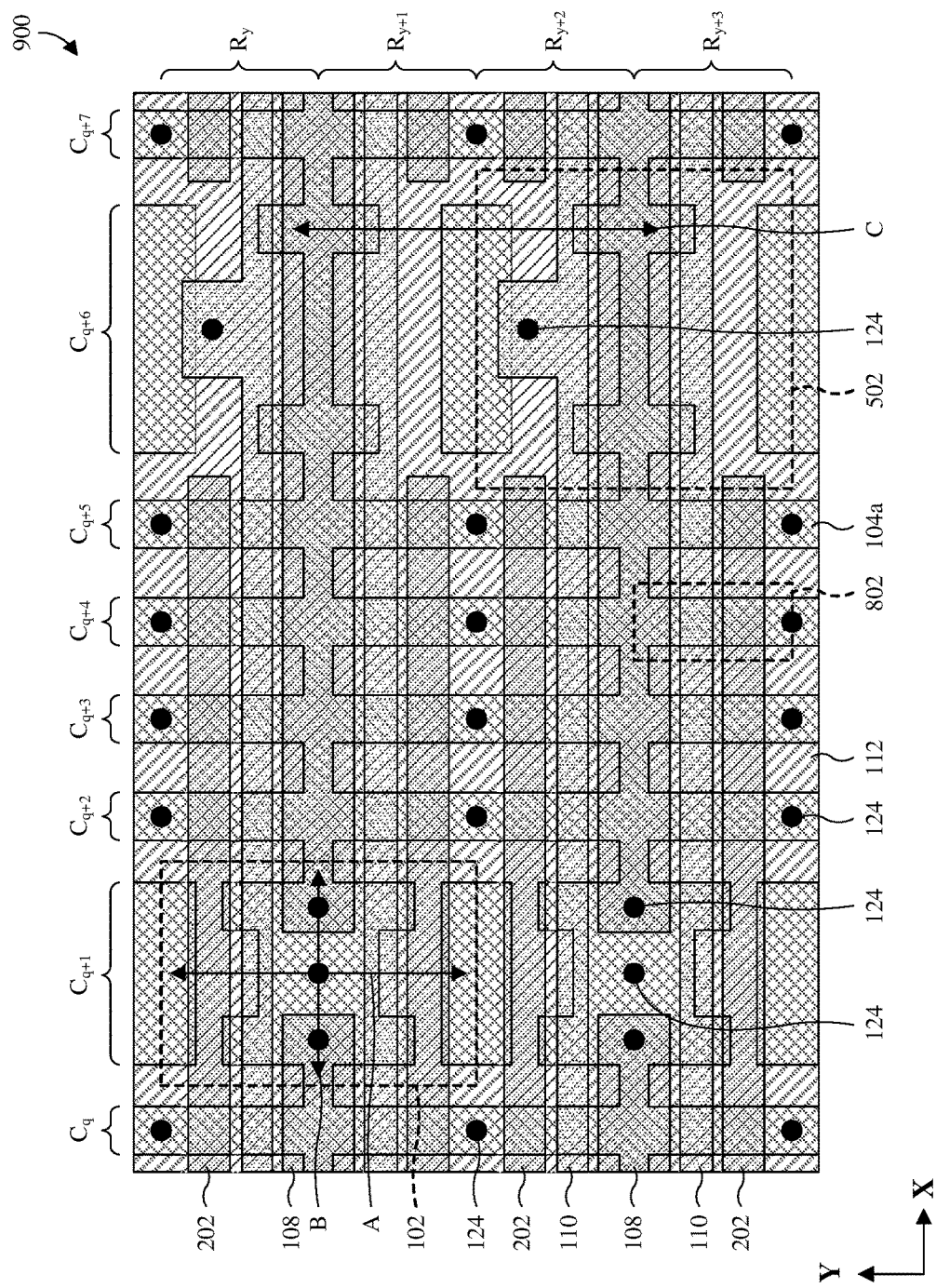
FIG. 9 illustrates a top layout of some embodiments of a portion of the memory array of FIG. 8.

With reference to FIG. 9, a top layout 900 of some embodiments of a portion of the memory array of FIG. 8 is provided. The top layout 900 may, for example, be taken within box E in FIG. 8, but other suitable locations are amenable. A plurality of EG lines 108, a plurality of CG lines 110, and a plurality of SG lines 202 are laterally elongated in parallel and partially define a plurality of cells in a plurality of rows and a plurality of columns. The rows are respectively labeled $R_y$ through $R_{y+3}$ and the columns are respectively labeled $C_q$ through $C_{q+7}$. The subscripts of the row and column labels identify corresponding row and column numbers. Further, y is an integer variable representing a row number whereas q is an integer variable representing a column number.

The plurality of cells comprises a plurality of source strap cells 102, a plurality of CG strap cells 502, and a plurality of memory cells 802. The plurality of cells overlap an active region 104a and a trench isolation structure 112 surrounding and demarcating the active region 104a. Further, the plurality of cells is electrically coupled to corresponding wires (not shown; see, e.g., FIG. 8) through corresponding contact vias 124. The source strap cells 102 may, for example, be as in any one or combination of FIGS. 1A-1C, 2A-2D, 3A, 3B, 4, and 5. Any one of FIGS. 1A and 2A-2D may, for example, be taken along line A and/or any one of FIGS. 1B, 3A, and 3B may, for example, be taken along line B. Further, the source strap cell 102 of FIG. 5 may, for example, be taken along line A. The CG strap cells 502 may, for example, be as in any one or combination of FIGS. 5, 6A, 6B, and 7 and/or any one of FIGS. 6A and 6B may, for example, be taken along line C. Further, the CG strap cells 502 of FIG. 5 may, for example, be taken along line C.

With reference to FIGS. 10-13 and 16-24, a series of cross-sectional views 1000-1300, 1600-2400 of some embodiments of a method for forming a memory device comprising a source strap cell and CG strap cells according to aspects of the present disclosure is provided. The method is employed to form the memory device of FIG. 5 but may, for example, alternatively be employed to form the memory device in any one or combination of FIGS. 1A-1C, 2A-2D, 3A, 3B, 4, 6A, 6B, and 7-9 or to form some other suitable memory device.

Figure 10:
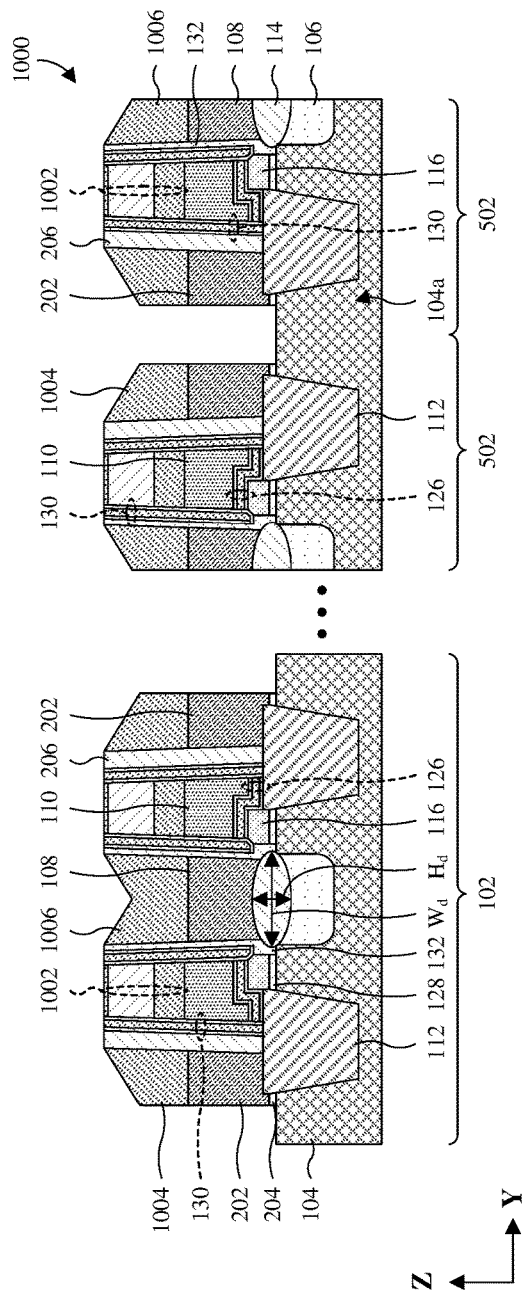

As illustrated by the cross-sectional view 1000 of FIG. 10, a source strap cell 102 and CG strap cells 502 are partially formed on a trench isolation structure 112 and an active region 104a of a substrate 104. The trench isolation structure 112 surrounds and demarcates the active region 104a. The source strap cell 102 and the CG strap cells 502 are defined in part by source lines 106, EG lines 108, CG lines 110, and SG lines 202 that are elongated in parallel (not visible in the cross-sectional view 1000). In some embodiments, the source strap cell 102 has the top layout at FIG. 4, less the contact vias 124 and the break 118, such that the EG line 108 of the source strap cell 102 is continuous. In some embodiments, the CG strap cells 502 have the top layout at FIG. 7, less the contact via 124 and the break 504, such that the SG lines 202 of the CG strap cells 502 are continuous. Other suitable top layouts are, however, amenable for the source strap cell 102 and/or the CG strap cells 502.

The SG lines 202 respectively border the CG lines 110 on first sides of the CG lines 110, and the CG lines 110 respectively overlie floating gates 116. Further, the source lines 106 respectively border the CG lines 110 on second sides of the CG lines 110, and the EG lines 108 respectively overlie the source lines 106 while remaining spaced from the source lines 106 by source dielectric layers 114. The source dielectric layers 114 have a ball or oval shaped cross-sectional profile, but other profiles are amenable. In some embodiments, an individual height $H_a$ of the source dielectric layers 114 is about 300-500 angstroms, about 300-400 angstroms, about 400-500 angstroms, or some other suitable values. In some embodiments, an individual width $W_d$ of the source dielectric layers 114 is about 500-800 angstroms, about 500-650 angstroms, about 650-800 angstroms, or some other suitable values.

The CG lines 110 are separated from the trench isolation structure 112 and the floating gates 116 by corresponding CG dielectric layers 126, and the floating gates 116 are separated from the substrate 104 by corresponding floating gate dielectric layers 128. Further, the SG lines 202 are separated from the substrate 104 by corresponding SG dielectric layers 204. The CG lines 110 are separated from the EG lines 108 and the SG lines 202 by corresponding CG sidewall spacers 130. The CG lines 110 are further separated from the EG lines 108 by corresponding EG tunnel dielectric layers 132 and are further separated from the SG lines 202 by corresponding SG sidewall spacers 206.

CG hard masks 1002 respectively cover the CG lines 110, and SG hard masks 1004 respectively cover the SG lines 202. Further, EG hard masks 1006 respectively cover the EG lines 108. The EG hard masks 1006 and/or the SG hard masks 1004 may, for example, be or comprise silicon nitride and/or some other suitable dielectric(s). The CG hard masks 1002 may, for example, be or comprise silicon oxide, silicon nitride, some other suitable dielectric(s), or any combination of the foregoing. In some embodiments, as illustrated, the CG hard masks 1002 are or comprise nitride-oxide-nitride (NON) films.

Figure 11:
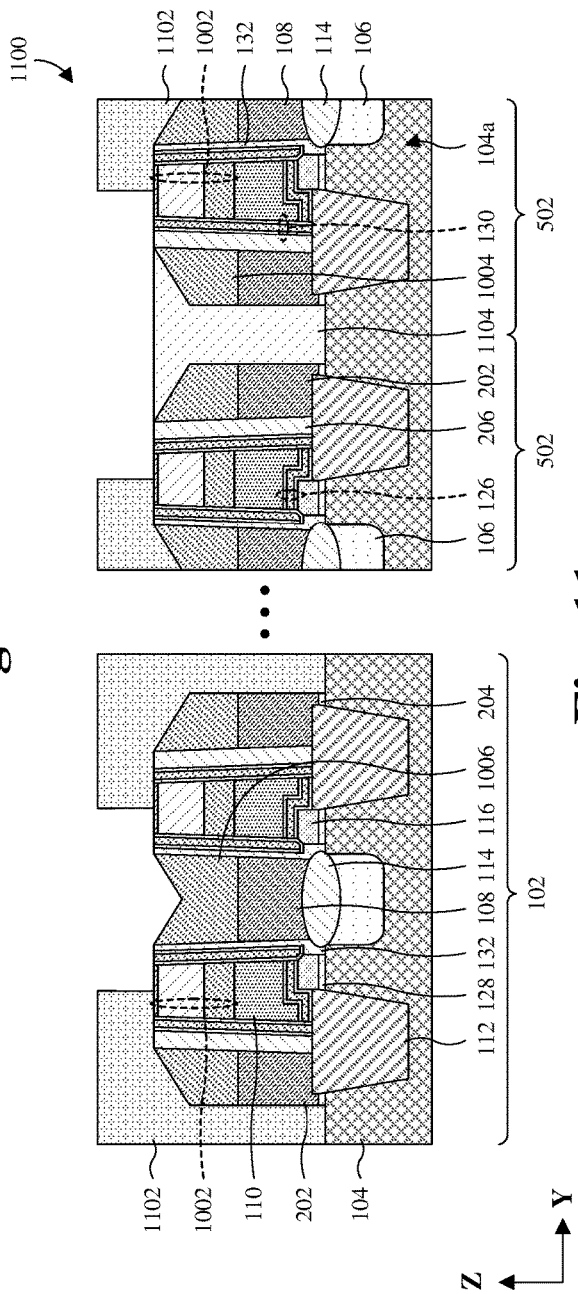

As illustrated by the cross-sectional view 1100 of FIG. 11, a first mask 1102 is formed partially covering the source strap cell 102 and the CG strap cells 502. In some embodiments, the first mask 1102 is or comprises photoresist and/or some other suitable mask material(s). Further, in some embodiments, the first mask 1102 is formed by photolithography and/or some other suitable process(es) for forming the first mask 1102.

Also illustrated by the cross-sectional view 1100 of FIG. 11, a sacrificial layer 1104 is formed filling a gap (see, e.g., FIG. 10) between the CG strap cells 502. The sacrificial layer 1104 may, for example, be or comprise bottom antireflective coating (B ARC) and/or some other suitable sacrificial material(s). In some embodiments, the sacrificial layer 1104 is formed of a material that is flowable and self-levels under the force of gravity so a top surface of the sacrificial layer 1104 is flat or substantially flat. A process for forming the sacrificial layer 1104 may, for example, comprise depositing the sacrificial layer 1104 by spin on coating and subsequently etching back the sacrificial layer 1104 until a top surface of the sacrificial layer 1104 is about even with top surfaces of the CG hard masks 1002. Other suitable processes are, however, amenable for forming the sacrificial layer 1104.

Figure 12:
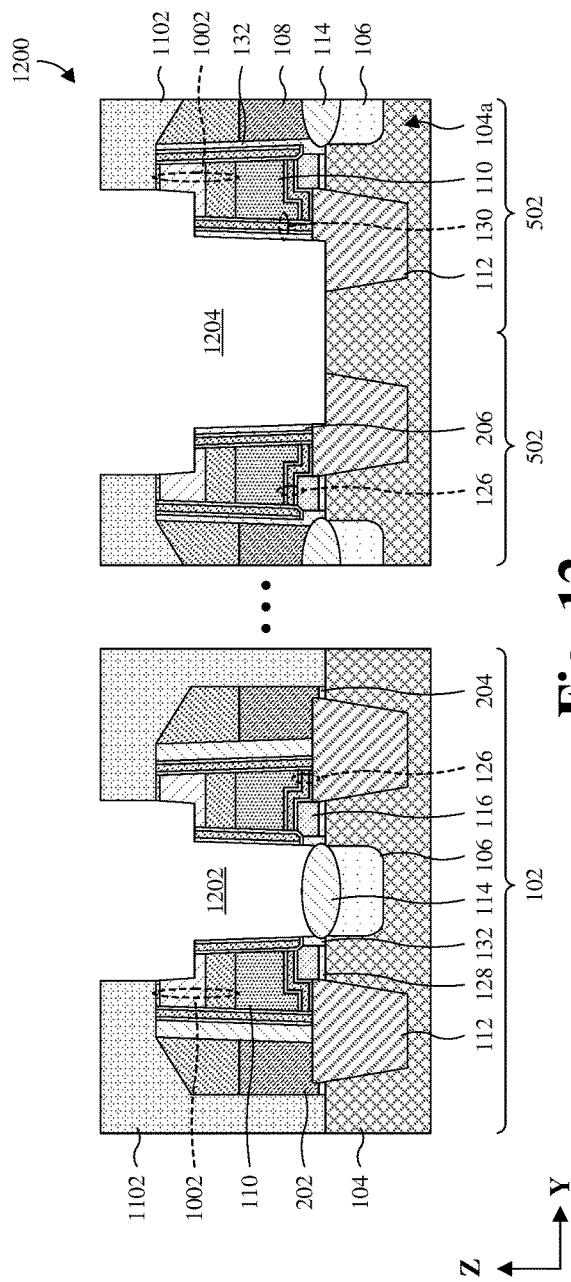

As illustrated by the cross-sectional view 1200 of FIG. 12, a first etch is performed into the source and CG strap cells 102, 502 with the first mask 1102 in place. The first etch may, for example, comprise or be performed by an anisotropic etch, a dry etch, some other suitable type of etch, or any combination of the foregoing.

The first etch stops on the source dielectric layer 114 of the source strap cell 102 and further stops on a portion of the substrate 104 between the CG strap cells 502. Further, in some embodiments, the first etch stops on a portion of the trench isolation structure 112 between the CG strap cells 502. In some embodiments, the source dielectric layers 114 and the trench isolation structure 112 are or comprise silicon oxide and/or are or comprise the same material. In some embodiments, an etchant employed by the first etch has high selectivity (e.g., a high etch rate) for material of the EG and SG lines 108, 202 relative to material of the source dielectric layers 114 and/or material of the substrate 104.

The first etch forms: 1) a first opening 1202 through the EG line 108 of the source strap cell 102 (see, e.g., FIG. 11); and 2) a second opening 1204 through the SG lines 202 of the CG strap cells 502 (see, e.g., FIG. 11). Further, the first etch fully or substantially removes the sacrificial layer 1104 (see, e.g., FIG. 11) and partially removes some of the dielectric layers in the first and second openings 1202, 1204. For example, the SG sidewall spacers 206 of the CG strap cells 502 are thinned or partially removed.

The sacrificial layer 1104 protects the substrate 104 between the CG strap cells 502 so the substrate 104 is not exposed to etchants for an entire duration of the first etch. If the substrate 104 was exposed to the etchants, a deep recess may form which could trap metal. Such trapped metal is difficult to remove and may hence cause contamination of process tools, undesired electrical shorting, or other suitable challenges.

Figure 13:
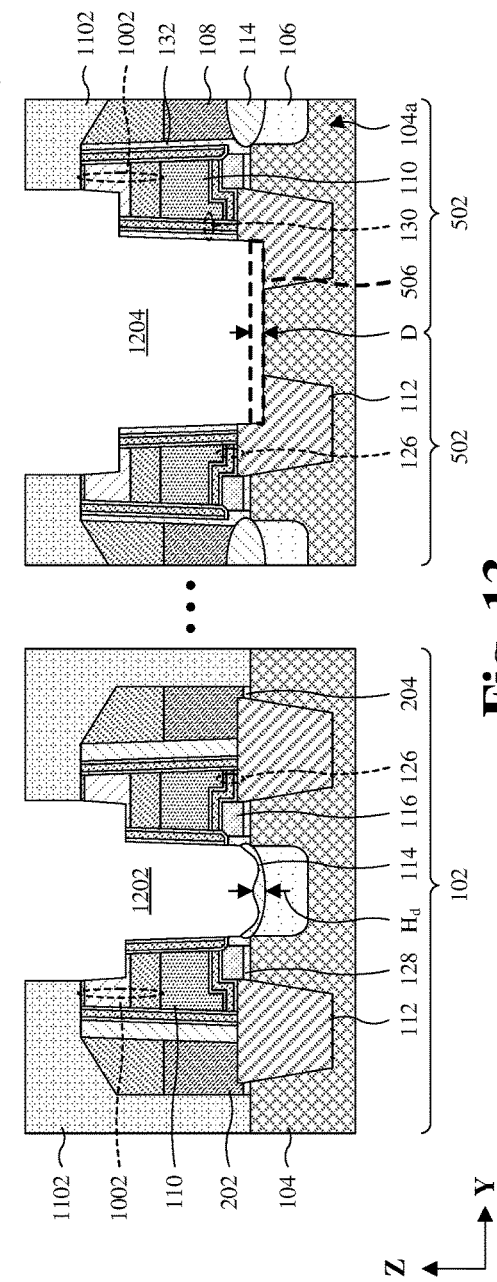

As illustrated by the cross-sectional view 1300 of FIG. 13, a second etch is performed with the first mask 1102 in place. The second etch is performed into the source dielectric layer 114 of the source strap cell 102 and an exposed portion of the substrate 104 between the CG strap cells 502. In some embodiments, the second etch is also performed into an exposed portion of the trench isolation structure 112 between the CG strap cells 502. In some embodiments, an etchant employed by the second etch is different than that employed by the first etch and/or has high selectivity (e.g., a high etch rate) for material of the source dielectric layers 114 and/or material of the substrate 104 relative to surrounding structure. As with the first etch, the second etch may, for example, comprise or be performed by an anisotropic etch, a dry etch, some other suitable type of etch, or any combination of the foregoing.

In some embodiments, the first and second etches are performed in situ. In other words, the first and second etches are performed within a common process chamber, such that the substrate 104 is within the common process chamber continuously from a beginning of the first etch to an end of the second etch. In alternative embodiments, the first and second embodiments are performed in different process chambers.

The second etch thins exposed portions of the CG hard masks 1002. In some embodiments in which the CG hard masks 1002 are or comprise NON films, the second etch stops on oxide layers of the NON films before reaching bottom nitride layers of the NON films. The second etch thins the source dielectric layer 114 of the source strap cell 102. Hence, the source dielectric layer 114 of the source strap cell 102 has a height $H_d$ that is less than before the thinning. Further, the second etch flattens the source dielectric layer 114 of the source strap cell 102 so a top surface of the source dielectric layer is flatter than before the second etch. For example, a difference between a highest point on the top surface and a lowest point on the top surface may be less than before the second etch. The second etch extends into the substrate 104 and the trench isolation structure 112 to form a recess 506 between the CG strap cells 502. The recess 506 has a depth D, which is measured from a top surface of the substrate 104, and may, for example, have the top layout in FIG. 7. For example, the recess 506 may have a C- or U-shaped top layout. Other suitable top layouts are, however, amenable.

In some embodiments, the height $H_d$ is about 300-500 angstroms, about 300-400 angstroms, about 400-500 angstroms, or some other suitable values before the second etch and/or is about 100-200 angstroms, about 100-150 angstroms, about 150-200 angstroms, or some other suitable values after the etch. If the height $H_d$ after the second etch is too small (e.g., less than about 100 angstroms or some other suitable value), the depth D may be too large. As discussed below, this may lead to trapped metal. If the height $H_d$ after the second etch is too large (e.g., greater than about 200 angstroms or some other suitable value), a subsequently described RPD etch may be unable to extend the first opening 1202 through the source dielectric layer 114 of the source strap cell 102. This may, in turn, degrade a process window for forming silicide and/or a contact via on the source dielectric layer 114 of the source strap cell 102.

In some embodiments, the depth D is greater than about 50 angstroms or greater than about 100 angstroms and/or is less than about 200 angstroms, less than about 250 angstroms, or less than about 300 angstroms. Other suitable values are, however, amenable. If the depth D is too large (e.g., greater than about 300 angstroms or some other suitable value), metal may become trapped in the recess 506. Such trapped metal may cause contamination of process tools, undesired electrical shorting, or other suitable challenges. If the depth D is too small (e.g., less than about 50 angstroms or some other suitable value), the source dielectric layer 114 of the source strap cell 102 may be insufficiently thinned at the first opening 1202 and the height Ha may be too large (see above).

Figure 14B:
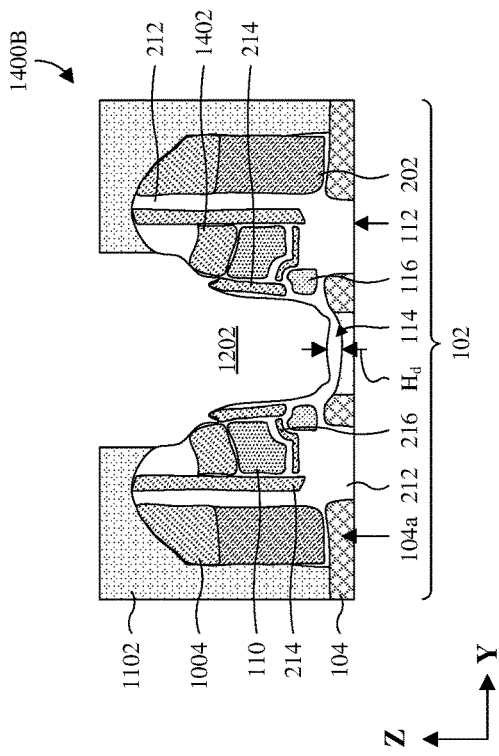
FIGS. 14A and 14B illustrate cross-sectional views of some alternative embodiments of the source strap cell at FIG. 13.
Figure 14A:
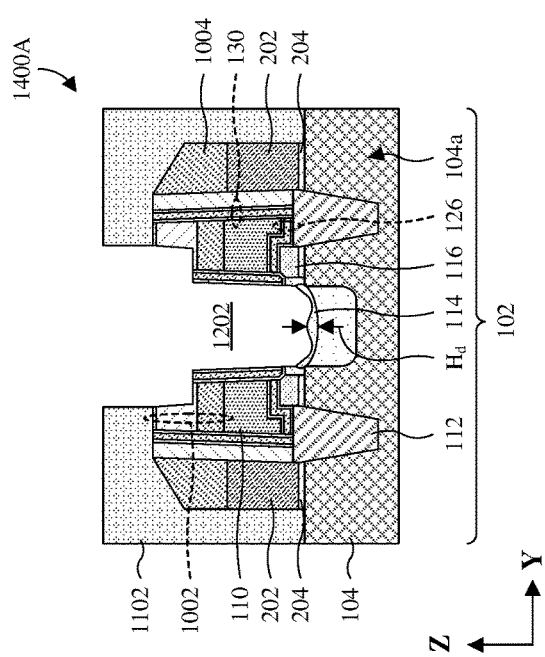

With reference to FIGS. 14A and 14B, cross-sectional views 1400A, 1400B of some alternative embodiments of the source strap cell 102 of FIG. 13 are provided. In FIG. 14A, the active region 104a of the substrate 104 and the trench isolation structure 112 have different layouts, such that the SG lines 202 are substantially to sides of the trench isolation structure 112. In FIG. 14B, a common dielectric structure 212 surrounds and separates constituents of the source strap cell 102. Among other things, the common dielectric structure 212 surrounds and separates the floating gates 116, the CG lines 110, sidewall spacers 214, gate dielectric layers 216, and hard masks 1402. Further, the common dielectric structure 212 defines constituents of the source strap cell 102. Among other things, the common dielectric structure 212 defines the source dielectric layer 114 and the trench isolation structure 112. The hard masks 1402 may, for example, be or comprise silicon nitride and/or some other suitable dielectric(s).

Figure 15B:
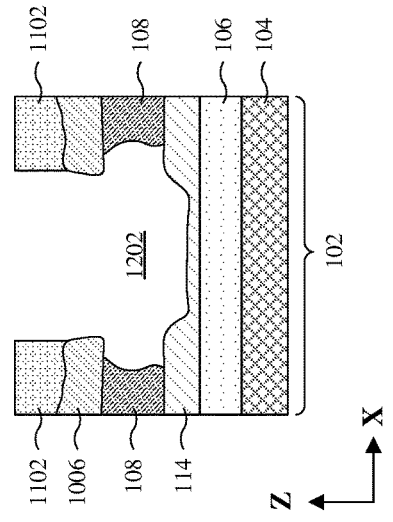
FIGS. 15A and 15B illustrate cross-sectional views of various embodiments of the source strap cell at FIG. 13 in a direction orthogonal to the cross-sectional view of FIG. 13.
Figure 15A:
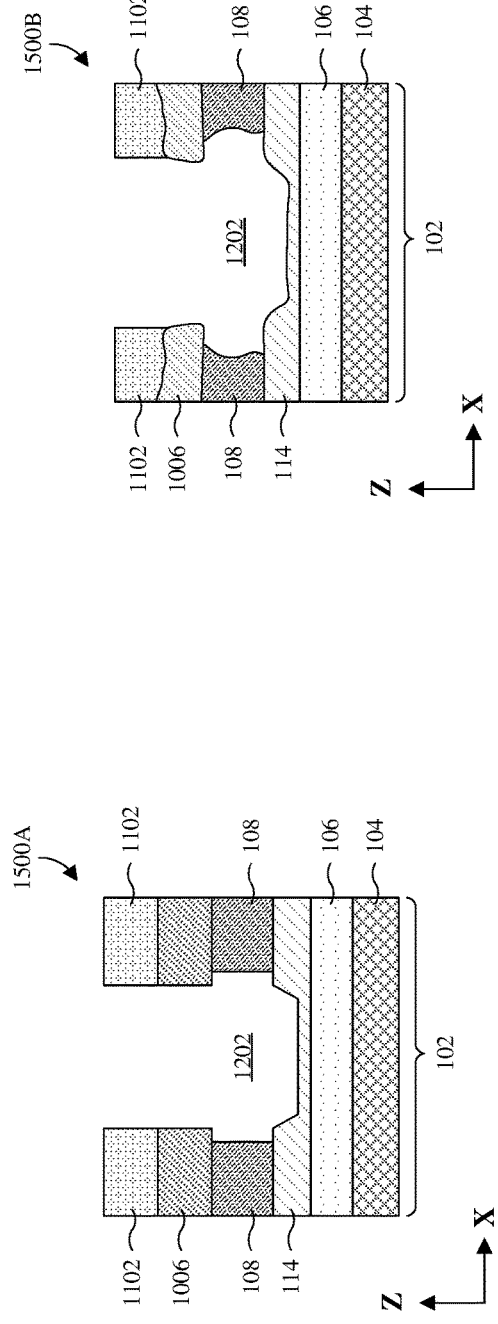

With reference to FIGS. 15A and 15B, cross-sectional views 1500A, 1500B of some embodiments of the source strap cell 102 of FIG. 13 are provided in a direction orthogonal to that of the cross-sectional view 1300 of FIG. 13. For example, FIGS. 15A and 15B may, for example, be in a X direction and FIG. 13 may be in Y direction. In FIG.

15A, the EG line 108 is recessed relative to the EG hard mask 1006 and the source dielectric layer 114 is indented where uncovered by the EG hard mask 1006 and the first mask 1102. In FIG. 15B, corners are more rounded and surfaces are less rectilinear.

In some embodiments, the source strap cell 102 of FIGS. 15A and 15B are taken along line B in any one or combination of FIGS. 1C, 4, and 9, whereas the source strap cell 102 of FIG. 13 is taken along line A in any one or combination of FIGS. 1C, 4, and 9. Further, in some embodiments, the cross-sectional views 1500A, 1500B of FIGS. 15A and 15B alternatively correspond to FIG. 14A and/or FIG. 14B instead of FIG. 13.

Referring back to FIGS. 10-13 and 16-24 and the series of cross-sectional views 1000-1300, 1600-2400 illustrated thereby, the first mask 1102 (see, e.g., FIG. 13) is removed at the cross-sectional view 1600 of FIG. 16. The removal may, for example, be performed by plasma ashing and/or some other suitable removal process.

Also illustrated by the cross-sectional view 1600 of FIG. 16, the source and CG strap cells 102, 502 are thinned and top surfaces thereof are flattened until about even. This includes thinning the SG hard masks 1004, the CG hard masks 1002, and the EG hard mask 1006 and flatting top surfaces of the hard masks. In some embodiments, a process for performing the thinning and the flattening comprises: 1) depositing a sacrificial layer covering the source and CG strap cells 102, 502; 2) etching back the sacrificial layer in parallel with the source and CG strap cells 102, 502; and 3) removing the sacrificial layer. Other processes are, however, amenable. The sacrificial layer has a top surface that is flat or substantially flat and may, for example, be or comprise BARC and/or some other suitable sacrificial material(s). In some embodiments, the sacrificial layer is formed of a flowable material that self-levels under the force of gravity so the top surface of the sacrificial layer is flat or substantially flat. A process for forming the sacrificial layer may, for example, comprise depositing the sacrificial layer by spin on coating. Other processes are, however, amenable.

As illustrated by the cross-sectional view 1700 of FIG. 17, main sidewall spacers 120 are formed on outer sidewalls of the source and CG strap cells 102, 502 and lining sidewalls of the source and CG strap cells 102, 502 at the first and second openings 1202, 1204. In some embodiments, a process for forming the main sidewall spacers 120 comprises: 1) depositing a spacer layer covering the source and CG strap cells 102, 502 and lining the sidewalls of the source and CG strap cells; and 2) performing an etch back into the spacer layer to remove horizontal, but not vertical, segments. Other processes are, however, amenable.

Because the source dielectric layer 114 of the source strap cell 102 is only thinned at the first opening 1202, the main sidewall spacers 120 in the first opening 1202 overlie the source dielectric layer. In some embodiments, the main sidewall spacers 120 in the first opening 1202 have bottom surfaces elevated above a topmost point of the substrate 104. Further, in some embodiments, the main sidewall spacers 120 in the first opening 1202 have bottom surfaces elevated above bottom surfaces respectively of the floating gates 116 and/or recessed relative to top surfaces respectively of the floating gates 116. Because the main sidewall spacers 120 in the first opening 1202 overlie the source dielectric layer 114 of the source strap cell 102, the main sidewall spacers have a height $H_{s1}$ that is smaller than it would otherwise be if the first opening 1202 extended through the source dielectric layer before formation.

Because the recess 506 extends into the substrate 104 and the trench isolation structure 112 between the CG strap cells 502, the main sidewall spacers 120 between the CG strap cells 502 also extend into the substrate 104 and the trench isolation structure 112. Because the main sidewall spacers 120 between the CG strap cells 502 extend into the substrate 104 and the trench isolation structure 112, the main sidewall spacers have a height $H_{s2}$ that is larger than it would otherwise be if the recess 506 did not exist. As noted above, the recess 506 occurs because the second etch uses the first mask 1102 (see, e.g., FIG. 13).

Figure 18:
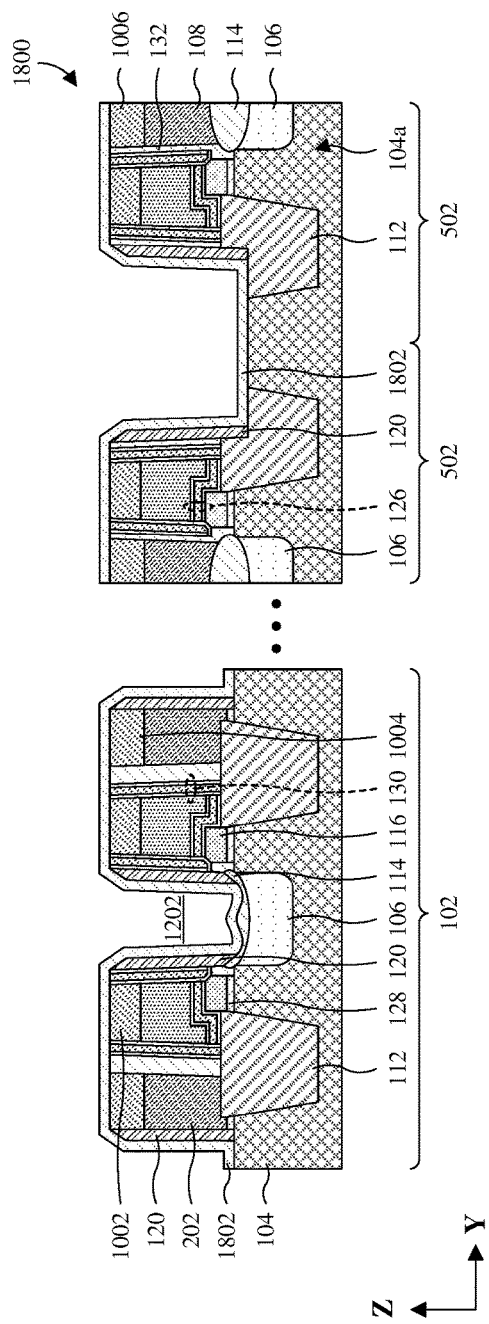

As illustrated by the cross-sectional view 1800 of FIG. 18, a resist protect dielectric (RPD) layer 1802 is deposited covering the source and CG strap cells 102, 502 and further lining sidewalls of the main sidewall spacers 120. The RPD layer 1802 may, for example, be or comprise silicon oxide and may, for example, therefore also be a RPO layer. Alternatively, the RPD layer 1802 may, for example, be or comprise some other suitable dielectric(s).

Figure 19:
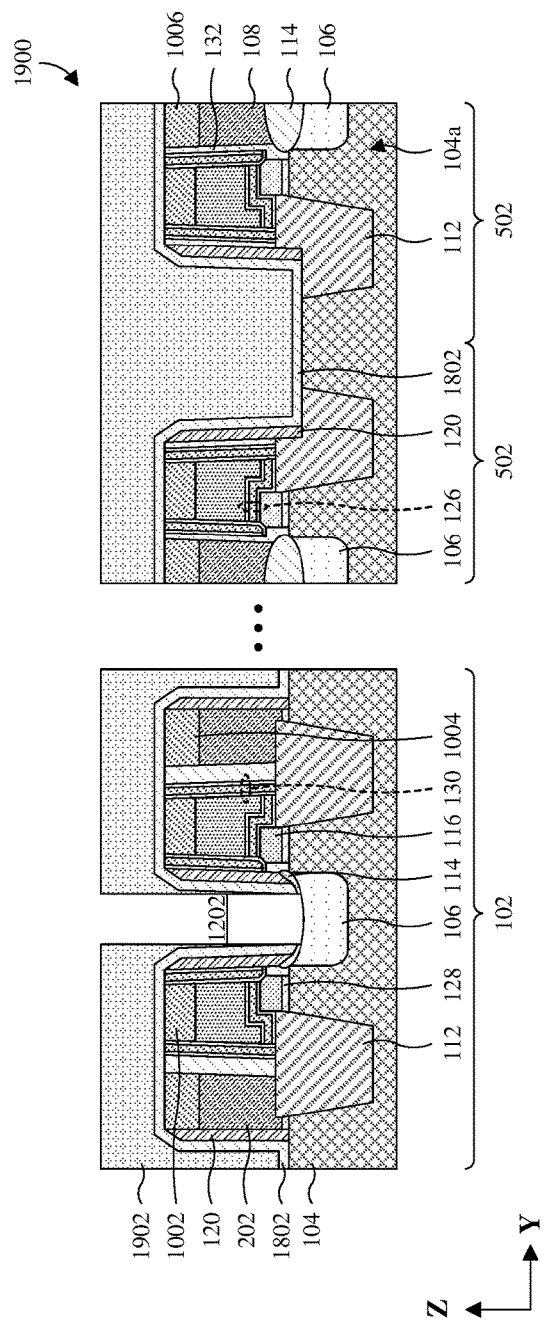

As illustrated by the cross-sectional view 1900 of FIG. 19, a second mask 1902 is formed on the RPD layer 1802. The second mask 1902 is formed with an opening overlying the source line 106 of the source strap cell 102. While not visible, the second mask 1902 may, for example, also include additional openings. The openings of the second mask 1902 may, for example, define a silicide pattern for subsequently formed silicide. In some embodiments, the second mask 1902 is or comprises photoresist and/or some other suitable mask material(s). Further, in some embodiments, the second mask 1902 is formed by photolithography and/or some other suitable process(es) for forming the second mask 1902.

Also illustrated by the cross-sectional view 1900 of FIG. 19, a third etch is performed into the RPD layer 1802 and the source dielectric layer 114 of the source strap cell 102 with the second mask 1902 in place. The third etch extends the first opening 1202 through the source dielectric layer 114 of the source strap cell 102 to expose the source line 106 of the source strap cell 102. The third etch may, for example, comprise or be performed by an anisotropic etch, a dry etch, some other suitable type of etch, or any combination of the foregoing. In some embodiments, the RPD layer 1802 and the source dielectric layer 114 of the source strap cell 102 are or comprise the same dielectric material, such that the third etch employs a single etchant.

As seen above, the second etch (see, e.g., FIG. 13) thins the source dielectric layer 114 of the source strap cell 102 in the first opening 1202, and then the third etch etches through the source dielectric layer, to extend the first opening 1202 to the source line 106 of the source strap cell 102. The second etch uses the first mask 1102 (see, e.g., FIG. 13) of the first etch (see, e.g., FIG. 12), and the third etch uses the second mask 1902 (see, e.g., FIG. 19). This two-step process for exposing the source line 106 of the source strap cell 102 is to be contrasted with a single-step process that exposes the source line by a single photolithography/etching process with a third mask different than the first and second masks 1102, 1902.

Because the present disclosure uses the two-step process, instead of the single-step process, the method may use one less photomask than it would otherwise use. Because photomasks are costly to form and photolithography process tools are costly to use, one less photomask is a substantial cost savings. Additionally, because one less photomask may be used, the risk of errant photoresist on the source line 106 of the source strap cell 102 is reduced. This enlarges the process window (e.g., makes the process more resilient) for forming silicide and/or a contact via on the source line 106 of the source strap cell 102. Too much scum on the source line 106 of the source strap cell 102 may prevent a silicide layer from fully forming on the source line, such that the silicide layer may be small. The small silicide layer may reduce the likelihood of the contact via fully landing on the silicide layer and may hence lead to a high resistance from the contact via to the source line. This high resistance may, in turn, shift operating parameters of the memory device out of specification and/or lead to low yields.

As noted above, the second etch thins the source dielectric layer 114 of the source strap cell 102 so the height $H_d$ (see, e.g., FIG. 13) is about 100-200 angstroms, about 100-150 angstroms, about 150-200 angstroms, or some other suitable values after the etch. If the height Ha is too large (e.g., greater than about 200 angstroms or some other suitable value), the third etch may be unable to extend the first opening 1202 through the source dielectric layer 114 of the source strap cell 102 without damage to structure (not shown) elsewhere on the substrate 104. For example, the third etch may also be employed to expose source/drain regions (not shown) elsewhere on the substrate 104. The source/drain regions may not be covered by source/drain dielectric layers and may, instead, only be covered by the RPD layer 1802. As such, extending the third etch through the source dielectric layer 114 of the source strap cell 102 may increase exposure of the source/drain regions to etchants during the third etch. This increased exposure may, in turn, damage the source/drain regions. If the height Ha is too large, the damage may be high and may hence shift operating parameters out of specification.

Figure 20:
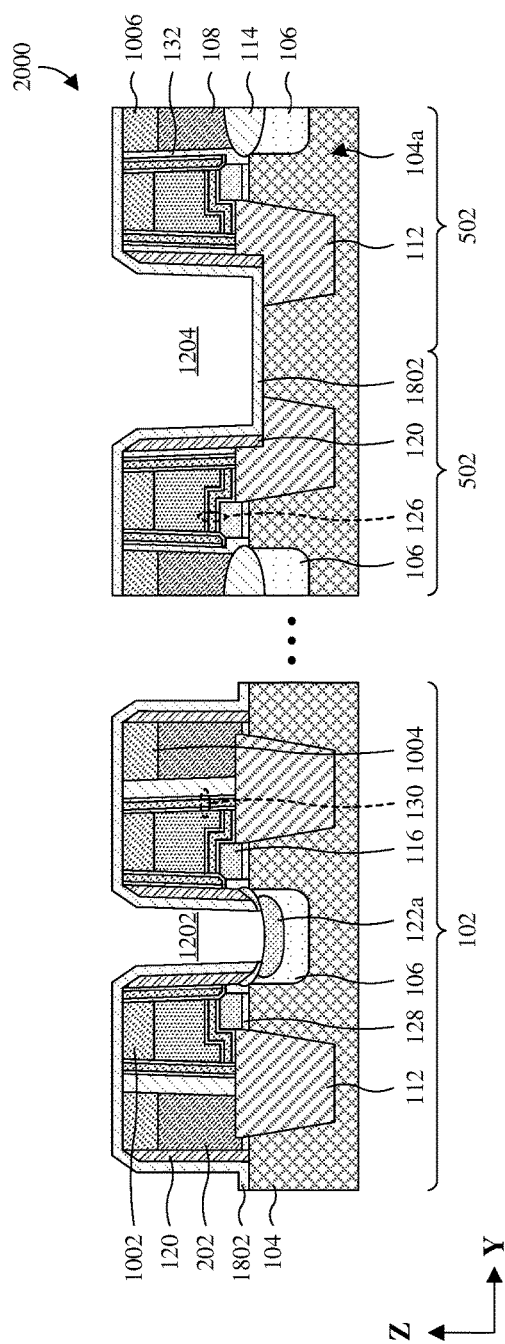

As illustrated by the cross-sectional view 2000 of FIG. 20, the second mask 1902 (see, e.g., FIG. 19) is removed and a source silicide layer 122a is formed on the source line 106 of the source strap cell 102. The removal may, for example, be performed by plasma ashing and/or some other suitable removal process. The source silicide layer 122a is formed by a process that forms silicide on silicon semiconductor regions uncovered by the RPD layer 1802, but not on silicon semiconductor regions covered by the RPD layer 1802. The process may, for example, be a salicide process or some other suitable process for forming silicide.

Figure 21:
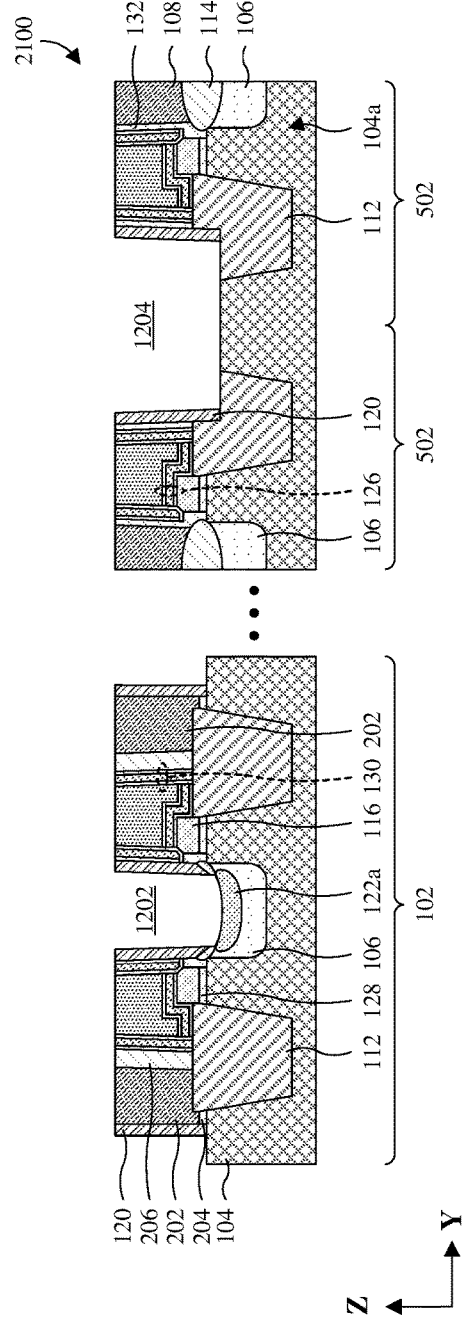

As illustrated by the cross-sectional view 2100 of FIG. 21, the RPD layer 1802 (see, e.g., FIG. 20) is removed. The removal may, for example, be performed by an etching process or some other suitable etching process.

Also illustrated by the cross-sectional view 2100 of FIG. 21, the CG hard mask 1002, the SG hard masks 1004, and the EG hard masks 1006 are removed. In some embodiments, a process for performing the removal comprises: 1) depositing a sacrificial layer covering the source and CG strap cells 102, 502; 2) etching back the sacrificial layer in parallel with the source and CG strap cells 102, 502; and 3) removing the sacrificial layer. Other processes are, however, amenable. The sacrificial layer may, for example, be or comprise BARC and/or some other suitable sacrificial material(s). In some embodiments, the sacrificial layer is formed of a flowable material that self-levels under the force of gravity so the top surface of the sacrificial layer is flat or substantially flat. A process for forming the sacrificial layer may, for example, comprise depositing the sacrificial layer by spin on coating or some other suitable process.

As illustrated by the cross-sectional view 2200 of FIG. 22, a CESL 208 and a first interconnect dielectric layer 134a are deposited covering the source and CG strap cells 102, 502 and further filling the first and second openings 1202, 1204 (see, e.g., FIG. 21). The first interconnect dielectric layer 134a may be or comprise, for example, silicon oxide and/or some other suitable dielectric(s).

As illustrated by the cross-sectional view 2300 of FIG. 23, a planarization is performed into the CESL 208 and the first interconnect dielectric layer 134a. The planarization persists until top surfaces respectively of the CESL 208 and the first interconnect dielectric layer 134a are about even with top surfaces respectively of the SG lines 202, the CG lines 110, and the EG lines 108. The planarization may, for example, be performed by a chemical mechanical polish or some other suitable planarization process.

Also illustrated by the cross-sectional view 2300 of FIG. 23, CG/EG silicide layers 122b are formed on the CG lines 110 and the EG lines 108. The CG/EG silicide layers 122b may, for example, be formed by a salicide process or some other suitable process.

Figure 24:
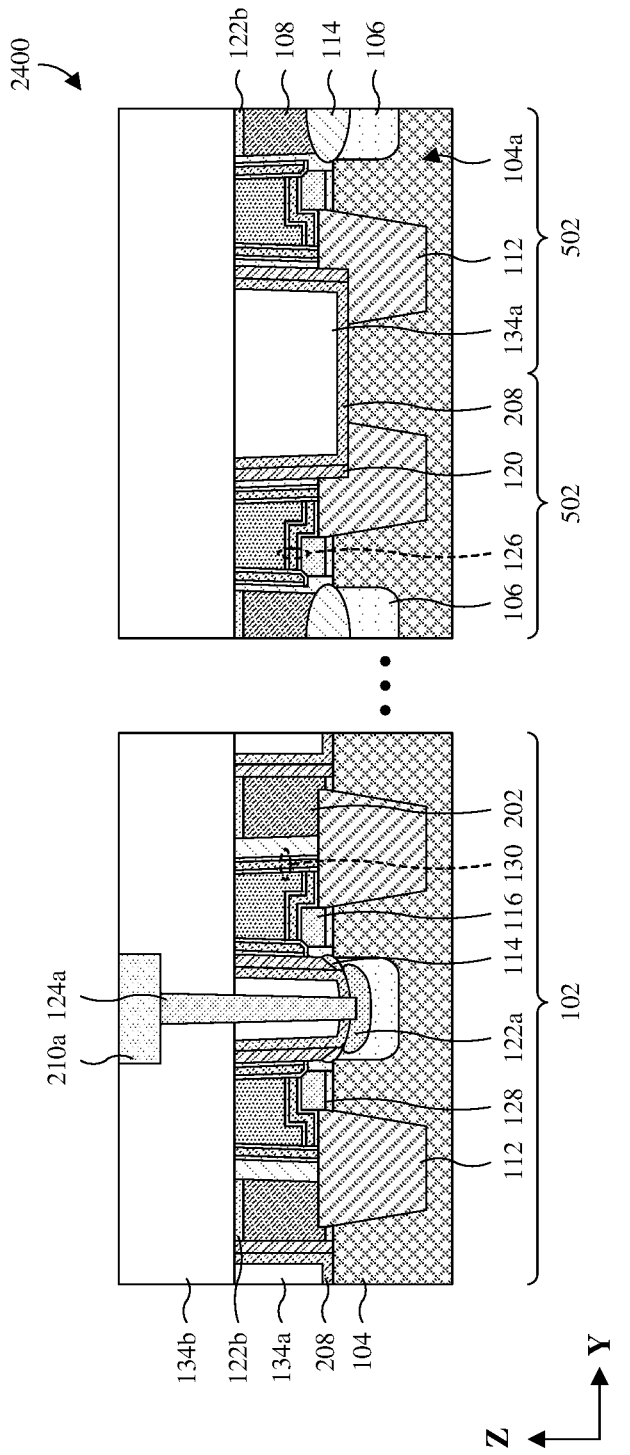

As illustrated by the cross-sectional view 2400 of FIG. 24, a second interconnect dielectric layer 134b is formed over the source and CG strap cells 102, 502 and the first interconnect dielectric layer 134a. The second interconnect dielectric layer 134b may be or comprise, for example, silicon oxide and/or some other suitable dielectric(s).

Also illustrated by the cross-sectional view 2400 of FIG. 24, a wire 210a and a contact via 124a are formed in the first and second interconnect dielectric layers 134a, 134b. The contact via 124a extends from the wire 210a, through the first and second interconnect dielectric layers 134a, 134b and the CESL 208, to the source silicide layer 122a. The CESL 208 may, for example, serve as an etch stop while forming the contact via 124a.

While FIGS. 10-13 and 16-24 are described with reference to various embodiments of a method, it will be appreciated that the structures shown in FIGS. 10-13 and 16-24 are not limited to the method but rather may stand alone separate of the method. While FIGS. 10-13 and 16-24 are described as a series of acts, it will be appreciated that the order of the acts may be altered in other embodiments. While FIGS. 10-13 and 16-24 illustrate and describe as a specific set of acts, some acts that are illustrated and/or described may be omitted in other embodiments. Further, acts that are not illustrated and/or described may be included in other embodiments.

Figure 25:
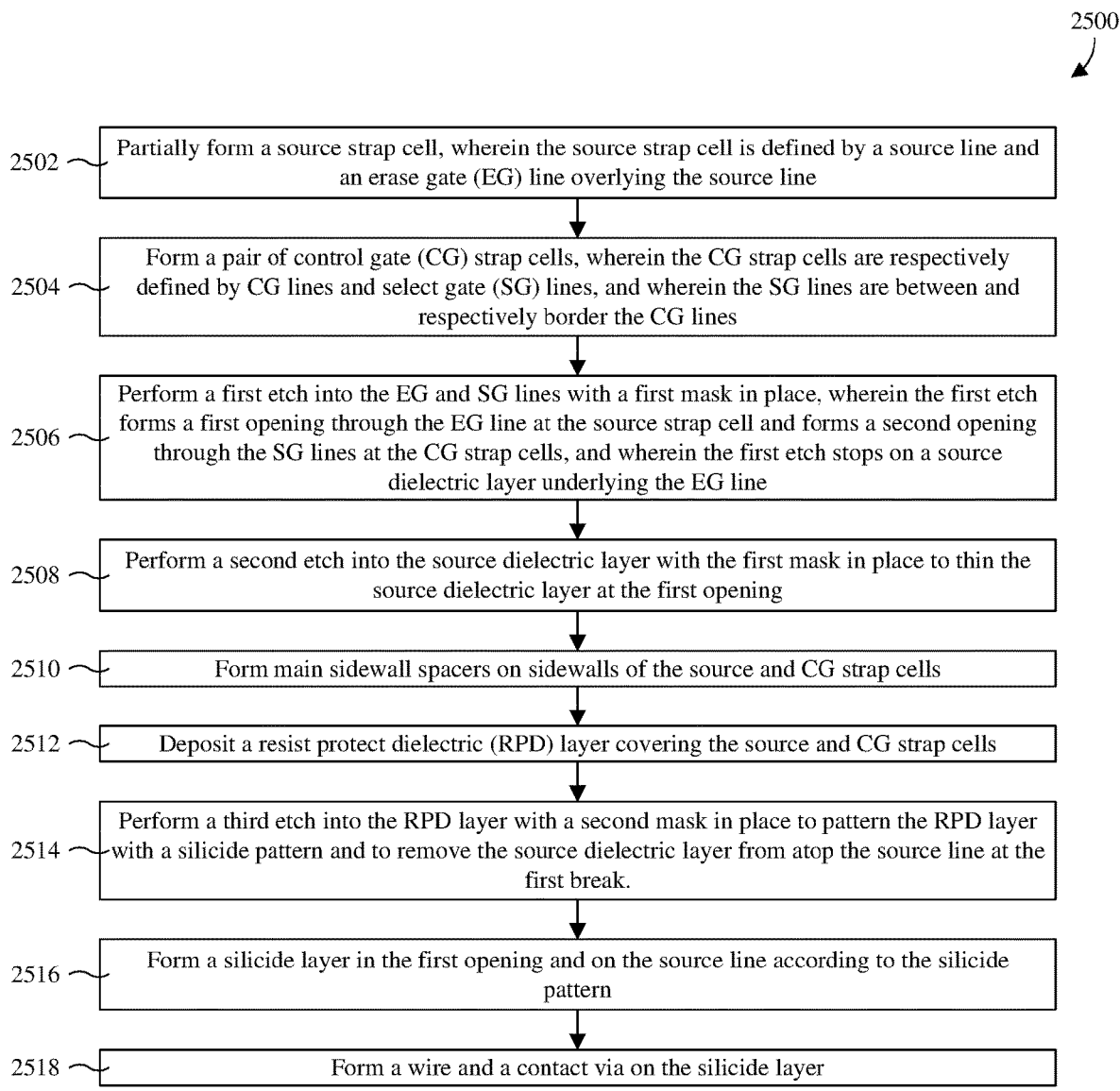
FIG. 25 illustrates a block diagram of some embodiments of the method of FIGS. 10-13 and 16-24.

With reference to FIG. 25, a block diagram 2500 of some embodiments of the method of FIGS. 10-13 and 16-24 is provided.

At 2502, a source strap cell is partially formed, wherein the source strap cell is defined by a source line and an EG line overlying the source line. See, for example, FIG. 10.

At 2504, a pair of CG strap cells are partially formed, wherein the CG strap cells are respectively defined by CG lines and SG lines, and wherein the SG lines are between and respectively border the CG lines. See, for example, FIG. 10.

At 2506, a first etch is performed into the EG and SG lines with a first mask in place, wherein the first etch forms a first opening through the EG line at the source strap cell and forms a second opening through the SG lines at the CG strap cells, and wherein the first etch stops on a source dielectric layer underlying the EG line. See, for example, FIG. 12.

At 2508, a second etch is performed into the source dielectric layer with the first mask in place to thin the source dielectric layer at the first opening. See, for example, FIG. 13.

At 2510, main sidewall spacers are formed on sidewalls of the source and CG strap cells. See, for example, FIG. 17.

At 2512, an RPD layer is deposited covering the source and CG strap cells. See, for example, FIG. 18.

At 2514, a third etch is performed into the RPD layer with a second mask in place to pattern the RPD layer with a silicide pattern and to extend the first opening through the source dielectric layer to the source line. See, for example, FIG. 19. Therefore, the source line is opened by a two-step process made up of the second and third etches. The two-step process is to be contrasted with a single-step process for opening the source line that uses a single photolithography/etching process with a mask different than the first and second masks.

At 2516, a silicide layer is formed in the first opening and on the source line according to the silicide pattern.

At 2518, a wire and a contact via are formed on the silicide layer. See, for example, FIG. 24.

Because the method uses the two-step process, instead of the single-step process, to open the source line the method may use one less photomask than it would otherwise use. This may reduce costs. Additionally, because one less photomask may be used, the risk of errant photoresist on the source line may be reduced. This may enlarge the process window for forming the silicide layer and/or the contact via on the source line.

While the block diagram 2500 of FIG. 25 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 26-32, a series of cross-sectional views 2600-3200 of some alternative embodiments of the method of FIGS. 10-13 and 16-24 is provided in which the active region 104a and the trench isolation structure 112 have different layouts. Further, the hard masks are fully removed before depositing the RPD layer.

As illustrated by the cross-sectional view 2600 of FIG. 26, a source strap cell 102 and CG strap cells 502 are partially formed on a trench isolation structure 112 and an active region 104a of a substrate 104. The trench isolation structure 112 and the active region 104a are as described with regard to FIG. 10, except that the trench isolation structure 112 and the active region 104a have different layouts than in FIG. 10.

As illustrated by the cross-sectional view 2700 of FIG. 27, the acts illustrated and described with regard to FIGS. 11 and 12 are performed. The first mask 1102 is formed partially covering the source strap cell 102 and the CG strap cells 502, and the sacrificial layer (not shown; see, e.g., 1104 in FIG. 11) is formed filling a gap (see, e.g., FIG. 26) between the CG strap cells 502. Further, the first etch is performed into the source and CG strap cells 102, 502 with the first mask 1102 in place to form the first and second openings 1202, 1204.

As illustrated by the cross-sectional view 2800 of FIG. 28, the second etch is performed into the source dielectric layer 114 of the source strap cell 102 and the exposed portion of the substrate 104 between the CG strap cells 502. The second etch is as described with regard to FIG. 13.

As illustrated by the cross-sectional view 2900 of FIG. 29, the acts illustrated and described with regard to FIGS. 17 and 21 are performed. The CG hard mask 1002, the SG hard masks 1004, and the EG hard masks 1006 are removed. Further, the main sidewall spacers 120 are formed on outer sidewalls of the source and CG strap cells 102, 502 and lining sidewalls of the source and CG strap cells 102, 502 in the first and second openings 1202, 1204.

Figure 30:
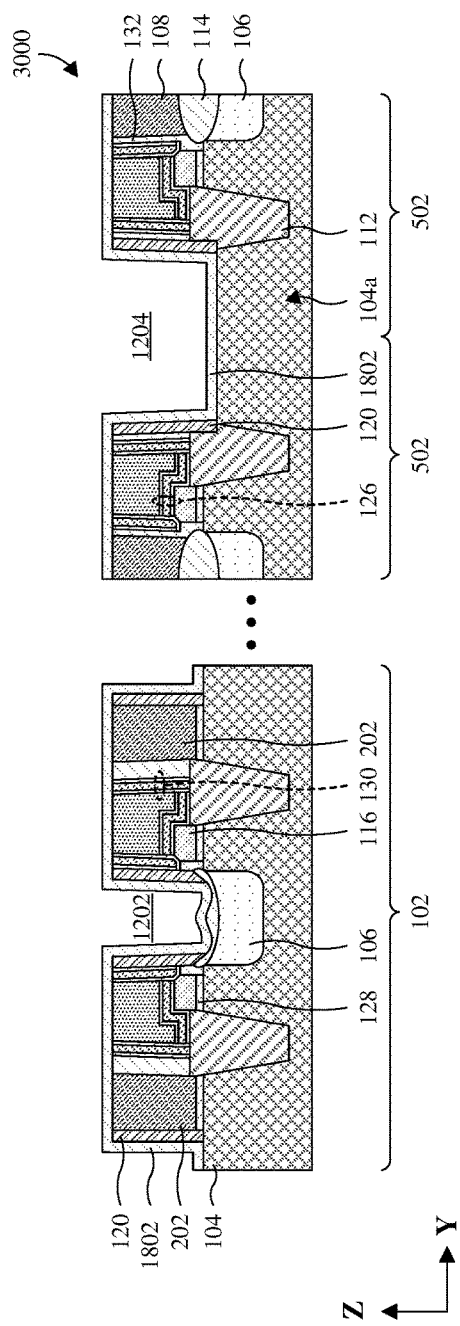

As illustrated by the cross-sectional view 3000 of FIG. 30, the RPD layer 1802 is formed covering the source and CG strap cells 102, 502 and further lining sidewalls of the main sidewall spacers 120. The RPD layer 1802 is formed as described with regard to FIG. 18.

Figure 31:
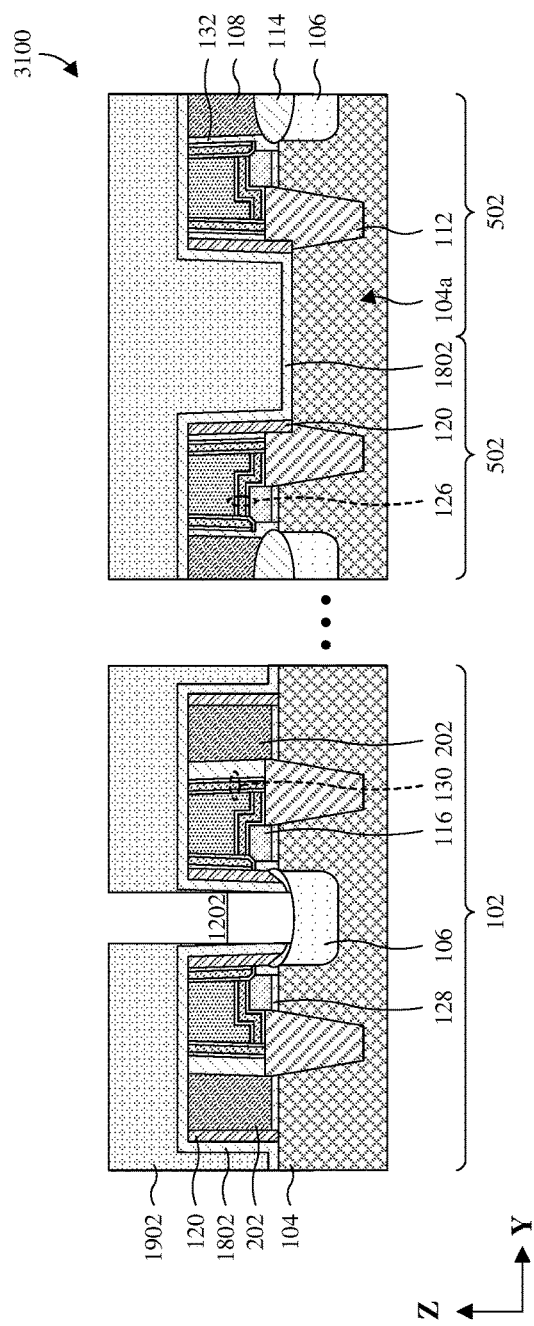

As illustrated by the cross-sectional view 3100 of FIG. 31, the acts illustrated and described with regard to FIG. 19 are performed. The second mask 1902 is formed on the RPD layer 1802. Further, the third etch is performed into the RPD layer 1802 and is extended into the source dielectric layer 114 of the source strap cell 102 to expose the source line 106 of the source strap cell 102 at the first opening 1202.

Figure 32:
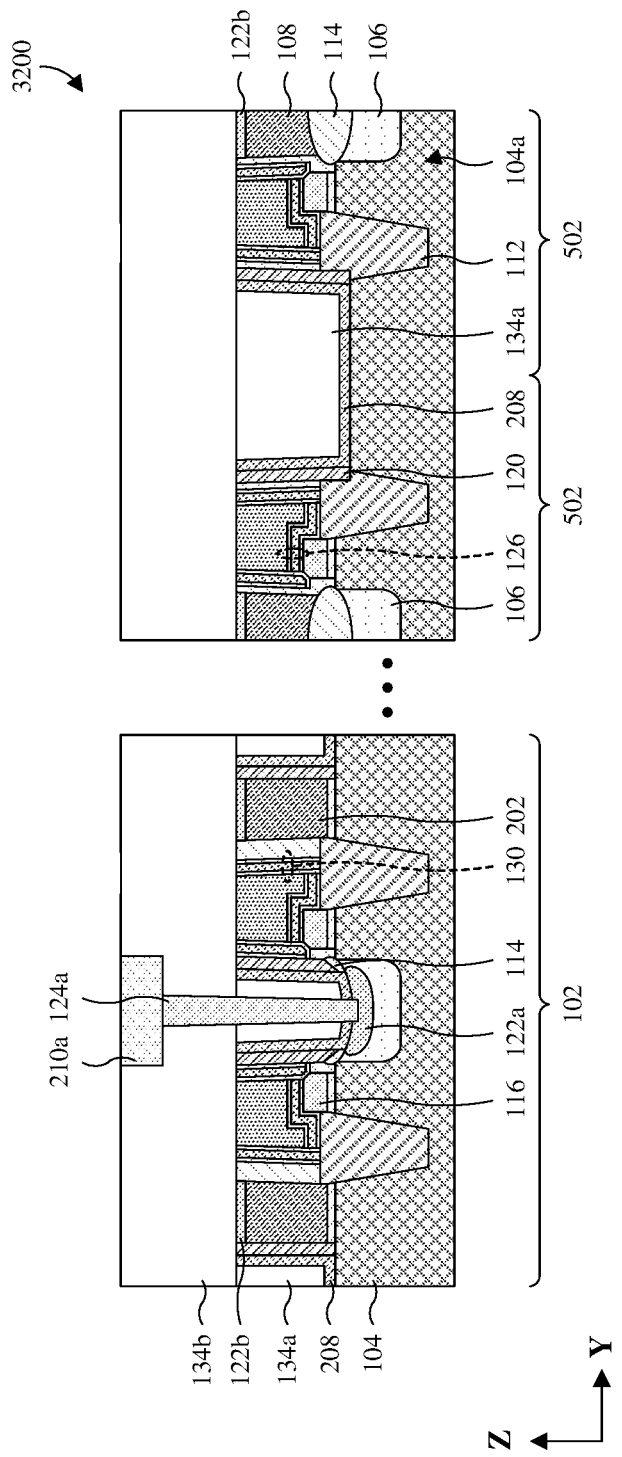

As illustrated by the cross-sectional view 3200 of FIG. 32, the acts illustrated and described with regard to FIGS. 20 and 22-24 are performed. The second mask 1902 is removed and the source silicide layer 122a is formed on the source line 106 of the source strap cell 102. The CESL 208 and the first interconnect dielectric layer 134a are deposited covering the source and CG strap cells 102, 502 and further filling the first and second openings 1202, 1204 (see, e.g., FIG. 13). The planarization is performed into the CESL 208 and the first interconnect dielectric layer 134a, and the CG/EG silicide layers 122b are formed on the CG lines 110 and the EG lines 108. The second interconnect dielectric layer 134b is formed over the source and CG strap cells 102, 502 and the first interconnect dielectric layer 134a. The wire 210a and the contact via 124a are formed.

While FIGS. 26-32 are described with reference to various embodiments of a method, it will be appreciated that the structures shown in FIGS. 26-32 are not limited to the method but rather may stand alone separate of the method. While FIGS. 26-32 are described as a series of acts, it will be appreciated that the order of the acts may be altered in other embodiments. While FIGS. 26-32 illustrate and describe as a specific set of acts, some acts that are illustrated and/or described may be omitted in other embodiments. Further, acts that are not illustrated and/or described may be included in other embodiments.

In some embodiments, the present disclosure provides an IC comprising: a memory device including: a substrate; an erase gate line, a control gate line, and a source line that are elongated in parallel in a first direction, wherein the erase gate line has a break separating the erase gate line into a pair of erase gate segments in the first direction, wherein the control gate line borders the erase gate line, and wherein the source line underlies the erase gate line in the substrate; a source dielectric layer between the erase gate line and the source line; a main sidewall spacer overlying the source dielectric layer and the source line at a center between the erase gate segments; and a contact via extending through the erase gate line and the source dielectric layer at the break and electrically coupling with the source line. In some embodiments, the contact via is spaced from the main sidewall spacer and the source dielectric layer. In some embodiments, the main sidewall spacer has a bottom surface at least partially elevated above a topmost point of the substrate. In some embodiments, the main sidewall spacer and the source dielectric layer define a common sidewall facing the contact via. In some embodiments, the memory device further includes an etch stop layer (ESL) having a U-shaped profile at the center between the erase gate segments, wherein the U-shaped profile laterally contacts the main sidewall spacer. In some embodiments, the memory device further includes: a floating gate underlying the control gate line; and a control gate sidewall spacer overlying the floating gate and separating the control gate line from the main sidewall spacer. In some embodiments, the memory device further includes a silicide layer between and directly contacting the contact via and the source line. In some embodiments, a width of the silicide layer is about 800-1100 angstroms.

In some embodiments, the present disclosure provides: a substrate; a memory array including a plurality of cells, wherein the plurality of cells includes a source strap cell and a pair of control gate strap cells; an erase gate line and a source line partially defining the source strap cell and elongated in parallel in a first direction, wherein the source line underlies the erase gate line, and wherein the erase gate line has a first break in the first direction; a first control gate line, a second control gate line, and a pair of select gate lines partially defining the control gate strap cells and elongated in parallel in the first direction, wherein the select gate lines are between and respectively border the first and second control gate lines and have a second break in the first direction, and wherein the first control gate line has a pad protruding towards the second control gate line at the second break; and a trench isolation structure underlying the first and second control gate lines; wherein a top surface of the substrate has and has a recess with a U-shaped top layout that wraps around the pad at the second break. In some embodiments, the recess extends into the top surface of the substrate to a depth of about 100-300 angstroms. In some embodiments, contact vias extending respectively to the source line, the first control gate line, and the second control gate line respectively at the source strap cell and the control gate strap cells. In some embodiments, the first break separates the erase gate line into a pair of erase gate segments in the first direction, wherein the IC further includes: a source dielectric layer between the erase gate line and the source line; and a main sidewall spacer vertically separated from the substrate by the source dielectric layer proximate the first break and at a location spaced from and between the erase gate segments. In some embodiments, the location is equidistant from the erase gate segments.

In some embodiments, the present disclosure provides a method for forming a memory device, the method including: forming an erase gate line and a source line that are elongated in parallel, wherein the source line underlies the erase gate line in a substrate and is separated from the erase gate line by a source dielectric layer; performing a first etch into the erase gate line to form a first opening extending through the erase gate line, wherein the first etch is performed with a first mask in place and stops on the source dielectric layer; performing a second etch into the source dielectric layer through the first opening, and with the first mask in place, to thin the source dielectric layer at the first opening; performing a silicide process to form a silicide layer on the source line at the first opening, wherein the silicide process includes a third etch that extends the first opening through the source dielectric layer and exposes the source line; and forming a contact via extending through the erase gate line to the silicide layer. In some embodiments, the silicide process includes a RPO etch, wherein the RPO etch removes the source dielectric layer at the first opening. In some embodiments, a portion of the source dielectric layer at the first opening has an oval shaped profile before the second etch, wherein a top surface of the portion has a W shaped profile after the second etch. In some embodiments, the method further includes forming a pair of control gate lines and a pair of select gate lines that overlie the substrate and that are elongated in parallel with the erase gate line, wherein the select gate lines are between and respectively border the control gate lines, wherein one of the control gate lines has a pad protruding towards another one of the control gate lines, and wherein the first etch forms a second opening extending through the select gate lines at the pad. In some embodiments, the control gate lines are formed partially overlying a trench isolation structure extending into a top surface of the substrate, wherein the second etch forms a recess in the top surface of the substrate through the second opening, and wherein the recess wraps around the pad. In some embodiments, the method further includes: forming a pair of control gate lines overlying the substrate and elongated in parallel with the erase gate line, wherein the erase gate line is between and borders the control gate lines; and forming a main sidewall spacer between the control gate lines on sidewalls of the first opening, wherein the main sidewall spacer overlies the source dielectric layer at a center between discrete segments of the erase gate line that are separated by the first opening. In some embodiments, the silicide process includes: depositing a RPD layer covering the erase gate line and lining the first opening; performing a third etch into the RPD layer and the source dielectric layer with a second mask in place to extend the first opening through the RPD layer and the source dielectric layer; forming the silicide layer on the source line and with the RPD layer in place; and removing the RPD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
    a substrate;
    an erase gate line and a source line elongated in parallel, wherein the erase gate line has a break separating the erase gate line into a pair of erase gate segments, and wherein the source line underlies the erase gate line in the substrate;
    a floating gate overlying the substrate, adjacent to the break;
    a source dielectric layer between the erase gate line and the source line; and
    a main sidewall spacer overlying the source dielectric layer and the source line at the break;
    wherein the main sidewall spacer and the source dielectric layer form a common sidewall facing away from the floating gate at the break, and wherein the main sidewall spacer is spaced from the floating gate.

2. The memory device according to claim 1, wherein a portion of the common sidewall formed by the source dielectric layer is a different dielectric type than another portion of the common sidewall formed by the main sidewall spacer.

3. The memory device according to claim 1, wherein the source dielectric layer comprises silicon oxide at the common sidewall, and wherein the main sidewall spacer comprises silicon nitride at the common sidewall.

4. The memory device according to claim 1, wherein the source dielectric layer is spaced from the floating gate.

5. The memory device according to claim 1, wherein the main sidewall spacer is non-overlapping with the floating gate when viewed top down and extends to an elevation level with a top of the erase gate line.

6. The memory device according to claim 1, wherein a bottom surface of the source dielectric layer arcs from a first side of the break to a second side of the break opposite the first side.

7. The memory device according to claim 1, further comprising:
   a contact etch stop layer directly on the common sidewall; and
   a contact via extending through the contact etch stop layer to the source line at the break.

8. A memory device comprising:
   a substrate; and
   a control gate line and a select gate line elongated in parallel, wherein the select gate line has a break separating the select gate line into a first select gate segment and a second select gate segment, and wherein the control gate line has a pad protruding through the select gate line at the break;
   wherein the pad has a first side and a second side respectively facing the first and second select gate segments on opposite sides of the pad, and wherein the substrate has a recess that wraps around the pad from the first side to the second side when viewed top down.

9. The memory device according to claim 8, further comprising:
   a trench isolation structure underlying the control gate line, wherein the trench isolation structure extends in a closed path to surround and demarcate a portion of the substrate at the break, and wherein the recess is at the portion of the substrate.

10. The memory device according to claim 9, wherein the portion of the substrate comprises a first region masked by the pad and further comprises a second region unmasked by the pad, and wherein the first region is elevated relative to the second region to form the recess.

11. The memory device according to claim 9, wherein a top geometry of the recess is complementary to a portion of the pad overlapping with the portion of the substrate.

12. The memory device according to claim 9, wherein the trench isolation structure has a stepped profile underlying the control gate line and stepping down towards the break to an elevation level with a recessed surface of the substrate in the recess.

13. The memory device according to claim 8, wherein the recess has a U-shaped top geometry wrapping around the pad.

14. The memory device according to claim 8, further comprising:
   an erase gate line elongated in parallel with the control gate line and the select gate line; and
   a source line underlying the erase gate line in the substrate and elongated in parallel with the erase gate line, wherein the control gate line is between and borders the erase gate line and the select gate line.

15. A memory device comprising:
   a substrate;
   an erase gate line and a source line elongated in parallel, wherein the erase gate line has a break separating the erase gate line into a pair of erase gate segments, and wherein the source line underlies the erase gate line in the substrate;
   a source dielectric layer between the erase gate line and the source line, wherein the source dielectric layer has a curved bottom surface portion recessed relative to a top surface of the substrate; and
   a main sidewall spacer overlying the source line and the curved bottom surface portion of the source dielectric layer at the break and directly contacting the source dielectric layer.

16. The memory device according to claim 15, wherein the main sidewall spacer and the source dielectric layer are different dielectric types.

17. The memory device according to claim 15, further comprising:
   a control gate line and a select gate line elongated in parallel with the erase gate line and the source line, wherein the control gate line is between and borders the select gate line and the erase gate line, and wherein the main sidewall spacer is level with the control gate line.

18. The memory device according to claim 15, further comprising:
   a pair of floating gates spaced from the main sidewall spacer, wherein the source line and the break are between and border the floating gates.

19. The memory device according to claim 15, wherein a bottom edge of the main sidewall spacer is recessed relative to the top surface of the substrate.

20. The memory device according to claim 15, further comprising:
   a silicide layer atop the source line, wherein the curved bottom surface portion directly contacts the silicide layer.

* * * * *